(12) United States Patent  (10) Patent No.: US 9,257,371 B2
Imura et al.  (45) Date of Patent: Feb. 9, 2016

(54) SEMICONDUCTOR DEVICE

(71) Applicant: RENESAS ELECTRONICS CORPORATION, Kanagawa (JP)

(72) Inventors: Chikako Imura, Kanagawa (JP); Koichi Kanemoto, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/645,899

(22) Filed: Mar. 12, 2015

(65) Prior Publication Data

US 2015/0187682 A1 Jul. 2, 2015

Related U.S. Application Data

(63) Continuation of application No. 14/016,429, filed on Sep. 3, 2013, now Pat. No. 8,987,882.

(30) Foreign Application Priority Data

Sep. 24, 2012 (JP) ................. 2012-209656

(51) Int. Cl.
*H01L 23/495* (2006.01)
*H01L 23/00* (2006.01)

(52) U.S. Cl.
CPC .... *H01L 23/49503* (2013.01); *H01L 23/49575* (2013.01); *H01L 24/49* (2013.01); *H01L 24/97* (2013.01); *H01L 24/45* (2013.01); *H01L 2224/32145* (2013.01); *H01L 2224/32245* (2013.01); *H01L 2224/45144* (2013.01); *H01L 2224/48095* (2013.01); *H01L 2224/48137* (2013.01); *H01L 2224/48145* (2013.01); *H01L 2224/48247* (2013.01); *H01L 2224/48257* (2013.01); *H01L 2224/49113* (2013.01); *H01L 2224/49171* (2013.01); *H01L 2224/49175* (2013.01); *H01L 2224/73265* (2013.01); *H01L 2224/92247* (2013.01); *H01L 2224/97* (2013.01); *H01L 2924/181* (2013.01)

(58) Field of Classification Search
CPC .................. H01L 23/49575; H01L 23/49503; H01L 23/49513
USPC .................................. 257/676, 777; 438/123
See application file for complete search history.

(56) References Cited

U.S. PATENT DOCUMENTS

| 6,906,415 | B2 * | 6/2005 | Jiang et al. ..................... 257/723 |
| 7,829,382 | B2 | 11/2010 | Karnezos et al. |
| 2004/0222508 | A1 | 11/2004 | Aoyagi |
| 2006/0138631 | A1 * | 6/2006 | Tao et al. ........................ 257/686 |

FOREIGN PATENT DOCUMENTS

JP 05-326817 A 12/1993

* cited by examiner

*Primary Examiner* — Theresa T Doan
(74) *Attorney, Agent, or Firm* — Mattingly & Malur, PC

(57) ABSTRACT

A semiconductor device is reduced in size. The semiconductor device includes a die pad, a plurality of leads arranged around the die pad, a memory chip and a power source IC chip mounted over the die pad, a logic chip mounted over the memory chip, a plurality of down bonding wires for connecting the semiconductor chip to the die pad, a plurality of lead wires for connecting the semiconductor chip to leads, and a plurality of inter-chip wires. Further, the logic chip is arranged at the central part of the die pad in a plan view, and the power source IC chip is arranged in a corner part region of the die pad in the plan view. This reduces the size of the QFN.

15 Claims, 28 Drawing Sheets

SEMICONDUCTOR DEVICE

CROSS-REFERENCE TO RELATED APPLICATIONS

The disclosure of Japanese Patent Application No. 2012-209656 filed on Sep. 24, 2012 including the specification, drawings and abstract is incorporated herein by reference in its entirety.

BACKGROUND

This invention relates to a semiconductor device in which, for example, a plurality of semiconductor chips are mounted over a die pad of a lead frame.

A structure of a multi-chip package in which a plurality of semiconductor chips are mounted over a tab part (die pad) is disclosed in, for example, Japanese Unexamined Patent Publication No. Hei 5 (1993)-326817 (Patent Document 1).

Patent Document

[Patent Document 1]
Japanese Unexamined Patent Publication No. Hei 5 (1993)-326817

SUMMARY

With a trend toward higher performances of a semiconductor device (semiconductor package), the number of semiconductor chips to be mounted in one semiconductor device tends to increase (see the Patent Document 1).

On the other hand, there has also been a demand for the size reduction of a semiconductor device. For this reason, for a semiconductor device using a lead frame as a base material, even if the outer size of the die pad (tab or chip mounting part) over which semiconductor chips are mounted is desired to be increased, there is a limit on the increase in size thereof. In other words, it is difficult to reduce the size of the semiconductor device in which a plurality of semiconductor chips are mounted.

An object of the embodiments disclosed in the present invention is to provide a technology which can achieve the size reduction of a semiconductor device.

Other problems and novel features of the present invention will be apparent from the description of this specification and the accompanying drawings.

A semiconductor device in accordance with one embodiment includes: a die pad having an upper surface and a lower surface; a plurality of suspension leads supporting the die pad, respectively; a plurality of lead groups arranged along sides of the die pad; a first main surface; and a plurality of first pad groups formed along sides of the first main surface. Further, the semiconductor device includes a first semiconductor chip having a first main surface and a first back surface, and arranged over the upper surface of the die pad, and arranged at the central part of the die pad in a plan view such that the first back surface faces to the upper surface of the die pad, and such that the sides of the first main surface are arranged in parallel with the sides of the upper surface of the die pad, respectively, in the plan view. Still further, the semiconductor device includes a second semiconductor chip having a second main surface, a second pad group formed over the second main surface, and a second back surface, and arranged over the upper surface of the die pad, and arranged next to the first semiconductor chip; and a plurality of first down bonding wire groups for electrically connecting the first pad groups of the first semiconductor chip to a plurality of down bonding regions of the die pad, respectively. Furthermore, a length of a side of the second main surface of the second semiconductor chip is larger than the distance between a first down bonding region of the down bonding regions of the die pad and a first die pad side of the sides of the upper surface of the die pad. The first die pad side is closest to the first down bonding region. Still further, the second semiconductor chip is arranged in a corner part region between the first down bonding region formed along the first die pad side of the die pad and a second down bonding region arranged along a second die pad side crossing with the first die pad side in the plan view.

In accordance with the one embodiment, it is possible to reduce the size of the semiconductor device.

DETAILED DESCRIPTION

In the following embodiments, unless particularly necessary, the same or similar portions will not be repeatedly described in principle.

Further, in the following embodiments, the description may be divided into a plurality of sections, or embodiments for convenience, if required. However, unless otherwise specified, these are not irrelevant to each other, but, are in a relation such that one is a modified example, a detailed explanation, a complementary explanation, or the like of a part or the whole of the other.

Further, in the following embodiments, when a reference is made to the number of elements, and the like (including number, numerical value, quantity, range, or the like), the number of elements is not limited to the specific number, but may be greater than or less than the specific number, unless otherwise specified, except the case where the number is apparently limited to the specific number in principle, or except for other cases.

Further in the following embodiments, it is needless to say that the constitutional elements (including element steps, or the like) are not always essential, unless otherwise specified, or except the case where they are apparently considered essential in principle, or except for other cases.

Further, in the following embodiments, it is naturally understood that the term "formed of A", "made of A", "having A", or "including A" used for a constitutional element does not exclude other elements, unless particularly "being only the element" is specified, or except for other cases. Similarly, in the following embodiments, when a reference is made to the shapes, positional relationships, or the like of the constitutional elements, or the like, it is understood that they include ones substantially analogous or similar to the shapes or the like, unless otherwise specified, or unless otherwise considered apparently in principle, or except for other cases. This also applies to the foregoing numerical values and ranges.

Below, the embodiments of the present invention will be described in details by reference to the accompanying drawings. Incidentally, in all the drawings for describing the embodiments, the members having the same function are given the same reference signs and numerals, and a repeated description thereon is omitted. Further, for easy understanding of the accompanying drawings, even a plan view may be hatched.

EMBODIMENTS

Figure 1:
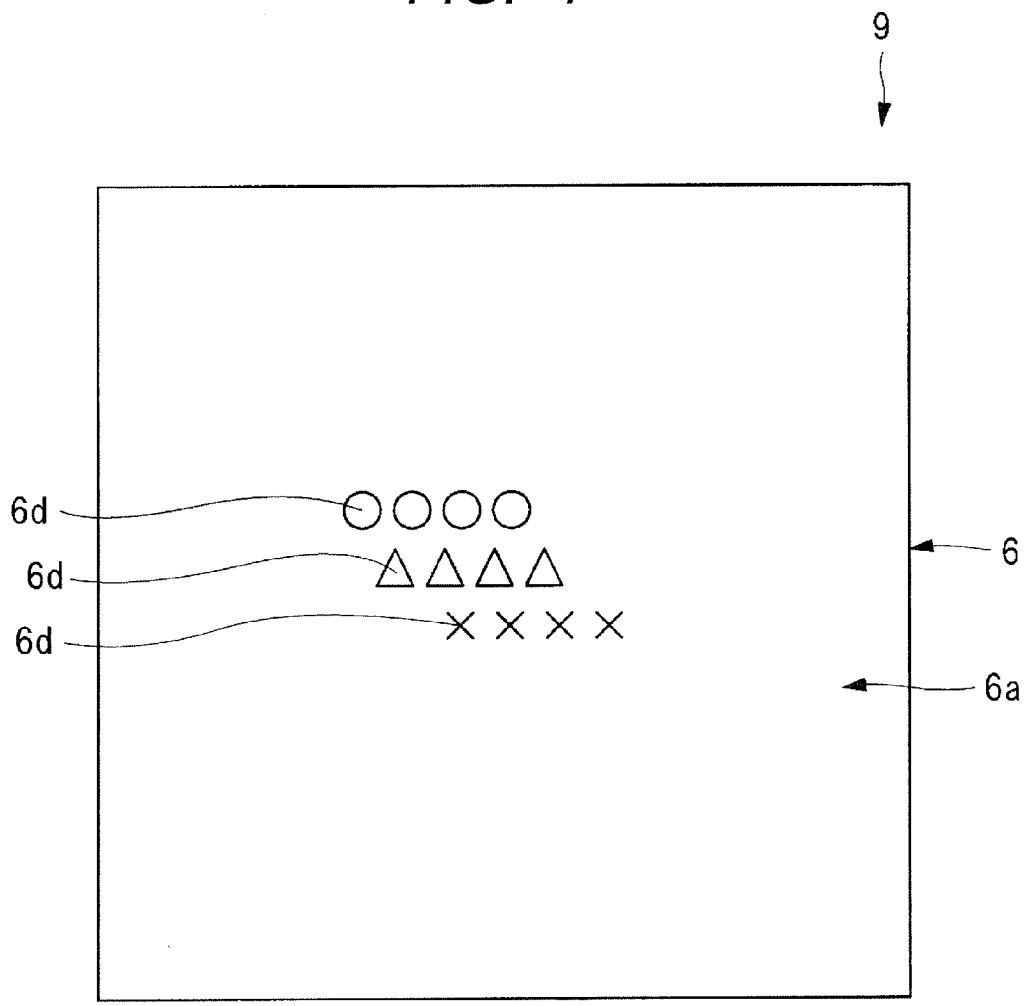
FIG. 1 is a plan view showing a structure of the front surface (mark forming surface) side of a semiconductor device of an embodiment.
Figure 2:
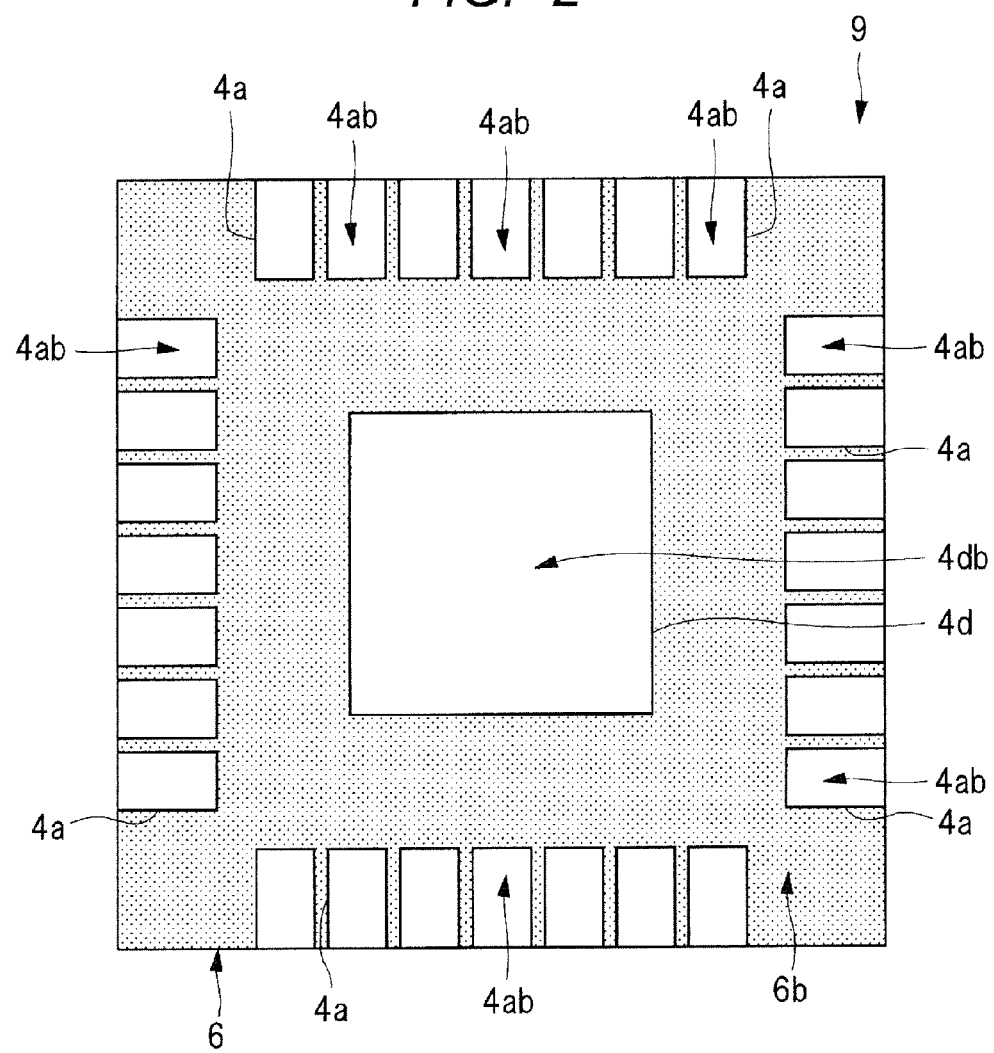
FIG. 2 is a bottom view showing a structure of the back surface (mounting surface) side of the semiconductor device shown in FIG. 1.
Figure 3:
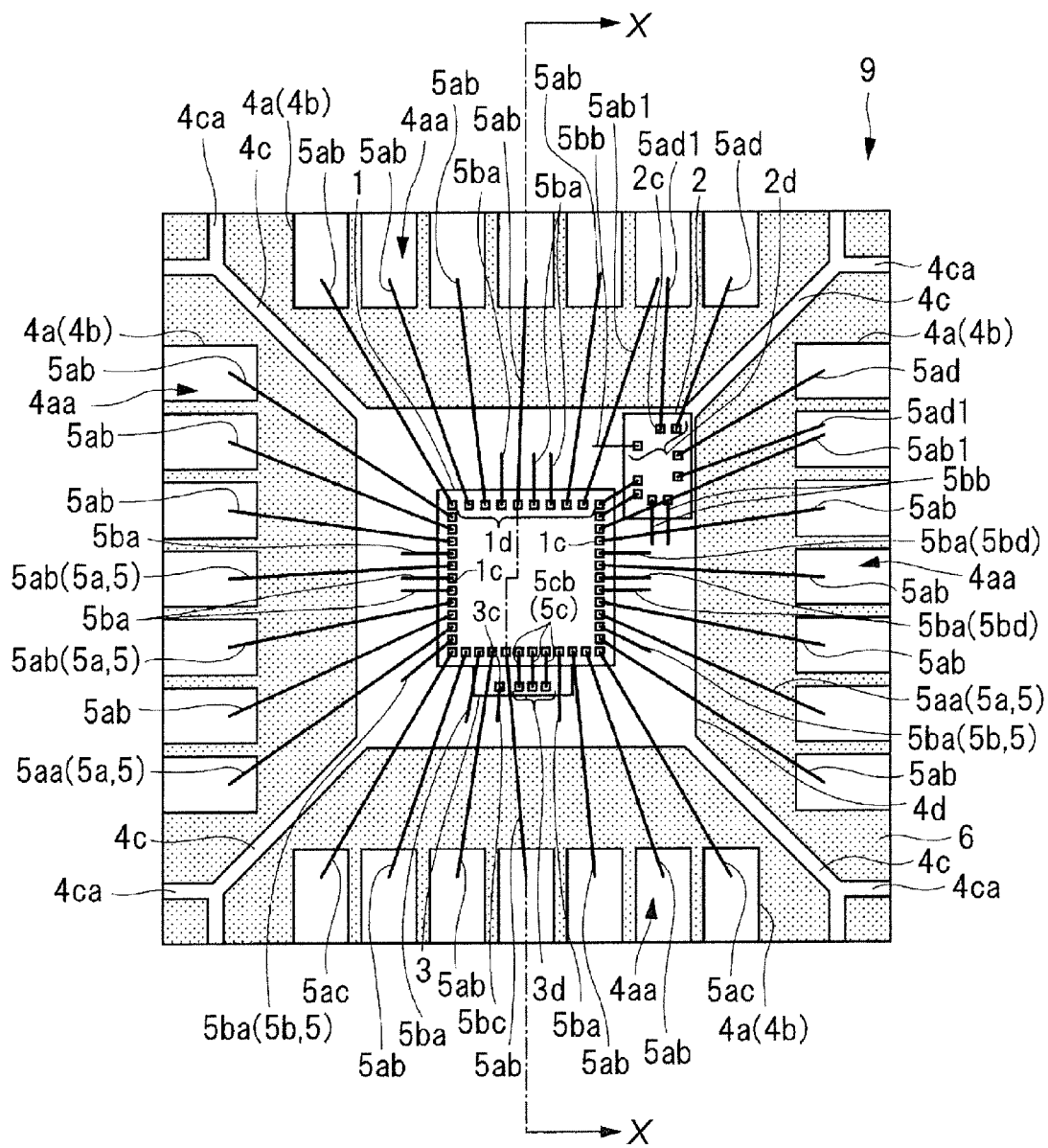
FIG. 3 is a transparent plan view showing the structure of the semiconductor device shown in FIG. 1 as seen through a sealing body.
Figure 4:
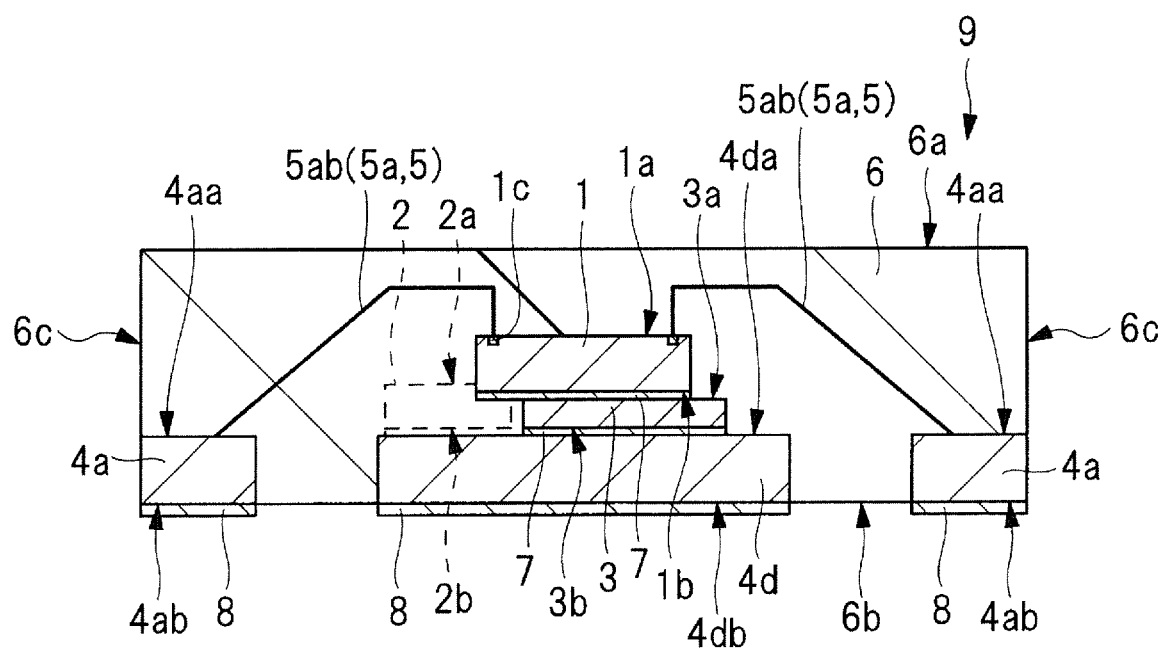
FIG. 4 is a cross-sectional view along line X-X shown in FIG. 3.
Figure 5:
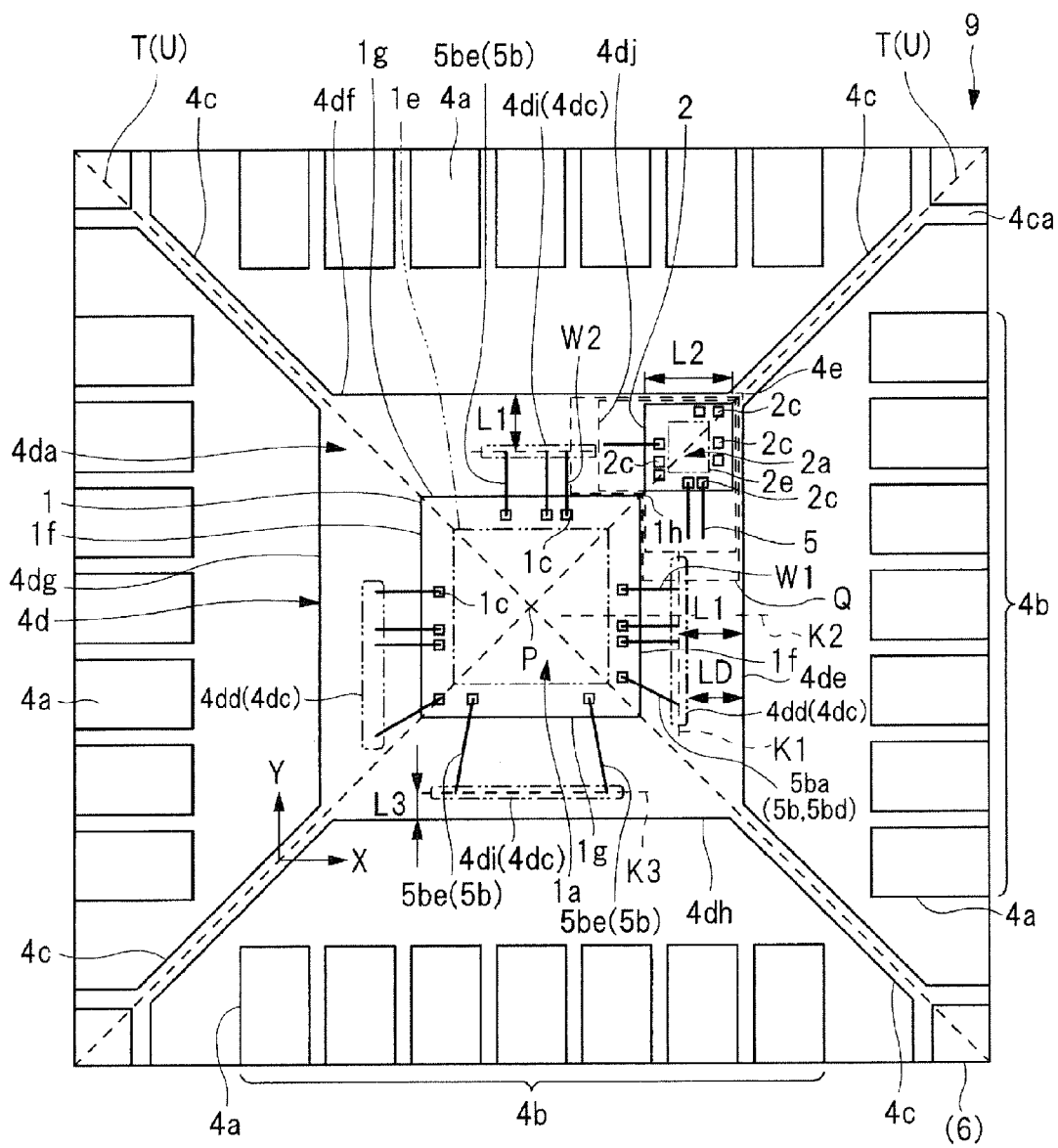
FIG. 5 is a plan view for illustrating the upper concept of an embodiment on the layout of a plurality of semiconductor chips over a die pad of the semiconductor device shown in FIG. 1.
Figure 6:
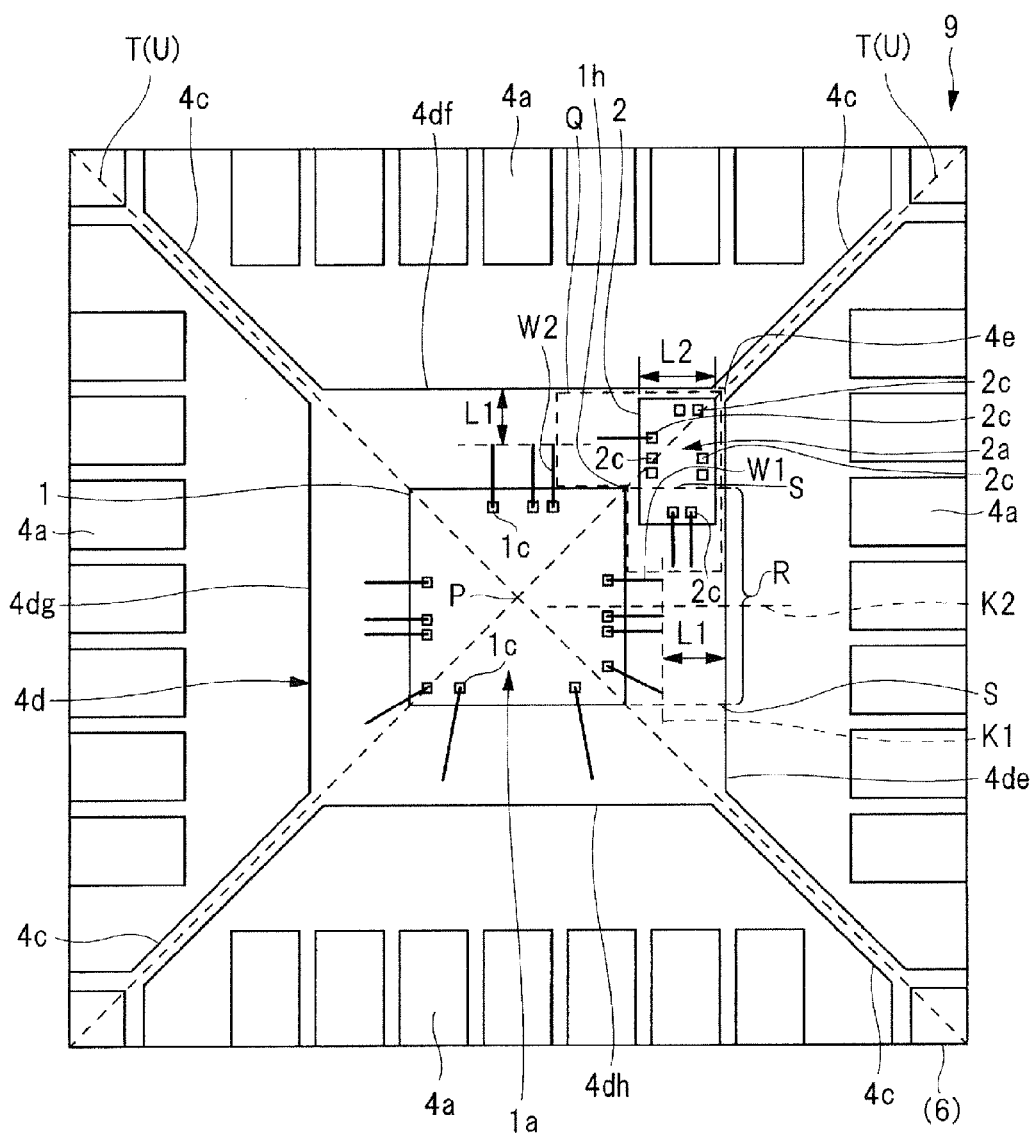
FIG. 6 is a plan view for illustrating the embodiment on the layout of the plurality of semiconductor chips over the die pad of the semiconductor device shown in FIG. 1.

FIG. 1 is a plan view showing a structure of the front surface (mark forming surface) side of a semiconductor device of an embodiment; FIG. 2 is a bottom view showing a structure of the back surface (mounting surface) side of the semiconductor device shown in FIG. 1; FIG. 3 is a transparent plan view showing the structure of the semiconductor device shown in FIG. 1 as seen through a sealing body; and FIG. 4 is a cross-sectional view along line X-X shown in FIG. 3. Further, FIG. 5 is a plan view for illustrating the upper concept of an embodiment on the layout of a plurality of semiconductor chips over a die pad of the semiconductor device shown in FIG. 1; and FIG. 6 is a plan view for illustrating the embodiment on the layout of the plurality of semiconductor chips over the die pad of the semiconductor device shown in FIG. 1.

<Semiconductor Device>

First, a description will be given to a structure of the semiconductor device of the present embodiment.

In the semiconductor device of the present embodiment, a plurality of leads 4a serving as external terminals of the semiconductor device are arranged at the peripheral part of the semiconductor device.

Particularly, the plurality of leads 4a are arranged along sides of the sealing body on the back surface (lower surface) of the semiconductor device as shown in FIG. 2. In other words, the plurality of leads 4a are respectively exposed from the back surface (lower surface) of the sealing body. Namely, the semiconductor device of the present embodiment is a so-called QFN (Quad Flat Non-leaded Package) 9.

Further, in the present embodiment, apart (back surface) of a die pad (tab or chip mounting part) 4d over which semiconductor chips are mounted is exposed from a sealing body 6.

Further, the QFN 9 includes, as shown in FIG. 3, the die pad (tab or chip mounting part) 4d having an upper surface (chip mounting surface) 4da, and a lower surface (back surface, mounting surface, or exposed surface) 4db opposite to the upper surface 4da. Incidentally, the die pad 4d of the present embodiment has a shape in a plan view substantially comprised of quadrangule as shown in FIGS. 2 and 3. Further, the QFN 9 includes a plurality of suspension leads 4c for supporting the die pad 4d, in other words, to be coupled to the die pad 4d. Incidentally, the number of the suspension leads 4c of the present embodiment is four. As shown in FIG. 3, the suspension leads 4c are respectively coupled to respective corner parts of the die pad 4d. Then, the plurality of suspension leads 4c extend, as shown in FIG. 3, along the diagonal lines of the die pad 4d from the die pad 4d toward respective corner parts of the sealing body 6, respectively. Further, the QFN 9 includes a plurality of leads (lead groups 4b) 4a arranged around the die pad 4d, and between the mutually adjacent suspension leads 4c of the plurality of suspension leads 4c. Incidentally, each of the plurality of leads (external terminals) 4a of the present embodiment has an upper surface (wire connecting surface) 4aa arranged on the same surface side as the upper surface 4da of the die pad 4d, and a lower surface (back surface or exposed surface) 4ab opposite to the upper surface 4aa. Herein, as shown in FIG. 4, the upper surface 4aa of the lead 4a and the upper surface 4da of the die pad 4d, and the lower surface 4ab of the lead 4a and the lower surface 4db of the die pad 4d are on the same plane (flush with each other), respectively. Then, the plurality of leads 4a are respectively arranged along sides of the die pad 4d in a plan view. Incidentally, as described above, the semiconductor device of the present embodiment is a QFN, and hence the lower surface 4ab of the lead 4a functions as a mounting surface.

Further, in the QFN 9, as shown in FIGS. 3 and 4, over the upper surface 4da of the die pad 4d, there are mounted a plurality of semiconductor chips 1, 2, and 3.

Herein, a description will be given to the semiconductor chips 1, 2, and 3 for use in the present embodiment.

First, all the three semiconductor chips for use in the present embodiment each have a shape in a plan view comprised of quadrangule. Further, the kinds of respective semiconductor chips include, for example, a logic chip 1, a power source IC (Integrated Circuit) chip 2, and a memory chip 3. Further, the logic chip 1 of the present embodiment is, for example, a SOC (System On Chip), and controls the memory chip 3. Further, the logic chip 1 is also a chip for controlling the power source IC chip 2. On the other hand, the memory chip 3 of the present embodiment is, for example, a flash memory. However, the memory chip 3 may be another memory (semiconductor storage element) such as DDR (Double Date Rate)-SDRAM (Synchronous Dynamic Random Access Memory).

Further, the logic chip 1 is formed in substantially a square shape in plan configuration. As shown in FIG. 3, a plurality of pads (bonding pads or electrodes) 1c are formed along sides of the main surface (upper surface) thereof. On the other hand, the power source IC chip 2 is formed in a rectangular shape in plan configuration. As shown in FIG. 3, a plurality of pads (bonding pads or electrodes) 2c are formed along sides of the main surface (upper surface) thereof. Further, the memory chip 3 is formed in a rectangular shape in plan configuration. A plurality of pads (bonding pads or electrodes) 3c are formed along one side (one short side exposed from the logic chip 1) of the main surface (upper surface) thereof.

Then, the layout of respective semiconductor chips 1, 2, and 3 will be described in details.

In the QFN 9, the memory chip 3 is mounted at substantially the central part of the upper surface 4da of the die pad 4d, and, particularly, is arranged closer to one side (the bottom side shown in FIG. 3) side of the die pad 4d. Namely, as shown in FIG. 4, the memory chip 3 is mounted over the die pad 4d so that the distance (gap) between one short side of the memory chip 3 and one side (the bottom side shown in FIG. 3) of the die pad 4d is smaller than the distance (gap) between the other short side of the memory chip 3 and one side (the upper side shown in FIG. 3) of the die pad 4d. Then, over the memory chip 3, the logic chip 1 is stacked. At this step, as shown in FIG. 3, the logic chip 1 is mounted (stacked) over the memory chip 3 so that a plurality of pads (pad groups 3d) 3c of the memory chip 3 are exposed from the logic chip 1. In other words, the logic chip 1 is mounted (stacked) over the memory chip 3 so that a part of the logic chip 1 juts out from the memory chip (the other short side of the memory chip) 3 as shown in FIG. 4.

On the other hand, the power source IC chip 2 is, in a plan view, arranged next to the memory chip 3 (or the logic chip 1). In other words, the power source IC chip 2 is, in the plan view, mounted at the position of the corner part of the die pad 4d. Whereas, the mounting (arranging) site of the power source IC chip 2 will be described with the memory chip 3 as a comparative object. As shown in FIGS. 3 and 4, the memory chip 3 is mounted over the die pad 4d with the short side (the side on which the pads 3c are formed) of the memory chip 3 directed (facing) toward the side (the bottom side shown in FIG. 3) facing to the side (the upper side shown in FIG. 3) side of the die pad 4d in proximity to the power source IC chip 2. In other words, the logic chip 1 stacked over the memory chip 3 juts toward the side (the upper side shown in FIG. 3) side of the die pad 4d in proximity to the power source IC chip 2 as shown in FIG. 4. As a result, the gap formed between the logic chip 1 and the die pad 4d is mainly formed on the side (the upper side shown in FIG. 3) side of the die pad 4d in proximity to the power source IC chip 2.

Incidentally, each semiconductor chip is mounted via an adhesive material (die bonding material) 7. Incidentally, the adhesive material 7 of the present embodiment is, for example, an adhesive material 7 in a film form. However, an adhesive material 7 in a paste form may also be used.

Further, respective semiconductor chips are electrically connected to respective leads 4a and the die pad 4d via a plurality of wires 5, respectively. Incidentally, in the present embodiment, the wires (down bonding wires) for electrically connecting the logic chip 1 to the die pad 4d of the plurality of wires 5 are formed at sides of the logic chip 1. Further, in the present embodiment, the chips are also electrically connected with each other via the wires 5.

Further, as shown in FIGS. 2 and 4, the three semiconductor chips, the plurality of wires 5, respective portions of the plurality of leads 4a, a portion of the die pad 4d, and respective portions of the four suspension leads 4c are sealed by the sealing body 6 formed of a resin.

The QFN 9 of the present embodiment has a structure (die pad exposed type) in which the die pad 4d is exposed from the sealing body 6. For this reason, as shown in FIGS. 2 and 4, the lower surface 4db of the die pad 4d and the lower surfaces 4ab of the plurality of leads 4a are exposed from the lower surface (back surface) 6b of the sealing body 6. Therefore, the lower surface 4db of the die pad 4d and the lower surfaces 4ab of the plurality of leads 4a are respective exposed surfaces exposed at the lower surface (back surface) 6b of the sealing body 6, and are also the mounting surfaces of the QFN 9. Incidentally, the leads 4a are also exposed from the side surface (the surface between the upper surface 6a and the lower surface 6b) 6c of the sealing body 6 as shown in FIG. 4.

Further, as shown in FIG. 2, at the peripheral part of the lower surface (back surface or mounting surface) 6b of the sealing body 6, as shown in FIG. 2, respective lower surfaces 4ab of the plurality of leads 4a are exposed as for external connection.

On the other hand, as shown in FIG. 1, on the upper surface (front surface or mark forming surface) 6a of the sealing body 6, a mark 6d such as a product name is given.

Figure 11:
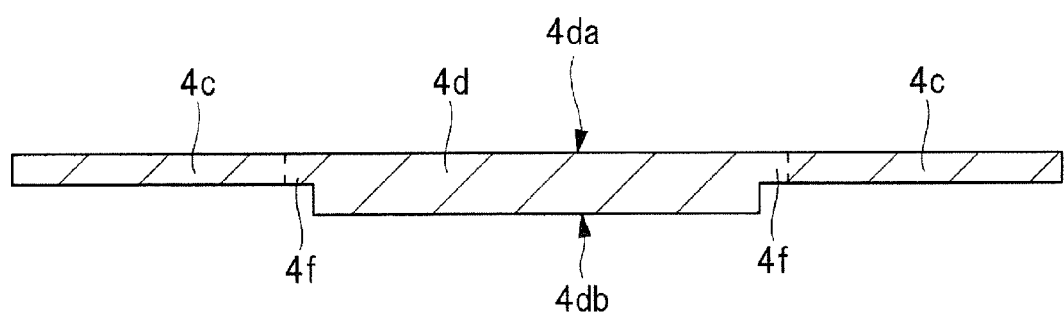
FIG. 11 is a cross-sectional view along line Y-Y shown in FIG. 8.
Figure 38:
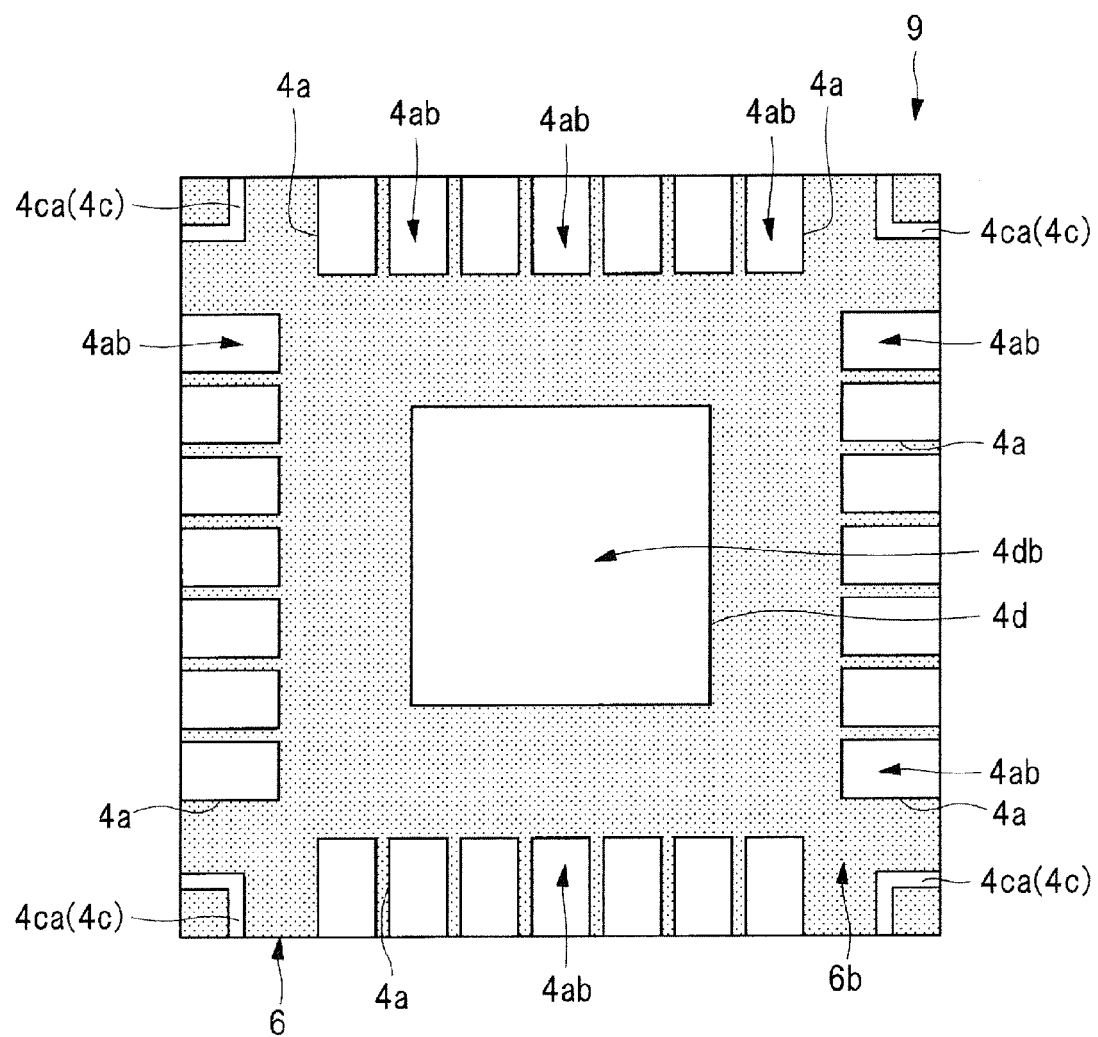
FIG. 38 is a bottom view showing the structure of the back surface (mounting surface) side of a semiconductor device of a modified example of an embodiment.

Further, the suspension leads 4c for supporting the die pad 4d are bonded to the die pad 4d at respective corner parts of the die pad 4d, respectively. Further, the suspension leads 4c extend along the diagonal lines of the die pad 4d from the die pad 4d toward respective corner parts of the sealing body 6, respectively. Further, the ends of the four suspension leads 4c opposite to the die pad 4d each have a bifurcated branch part 4ca, which reaches each side surface 6c (see FIG. 4) of the sealing body 6. Further, each suspension lead 4c is, as shown in FIG. 11, formed with a smaller thickness than those of the die pad 4d and the lead 4a by half etching or the like. For this reason, as shown in FIG. 2, each suspension lead 4c is not exposed from the lower surface 6b of the sealing body 6. Namely, the upper surface (the surface on the same surface side of the upper surface 4da of the die pad 4d) and the lower surface (the surface on the same surface side of the lower surface 4db of the die pad 4d) of each suspension lead 4c are covered with the sealing body 6. Incidentally, the shape of each suspension lead 4c may be formed as follows: for example, the region (first portion) between the portion bonded to the die pad 4d and the branch point of each suspension lead 4c is formed with a smaller thickness than those of the die pad 4d and the lead 4a, and the region (second portion or the branch part 4ca) between the branch point and the end (the portion exposed from the side surface 6c of the sealing body 6) of each suspension lead 4 is formed with the same thickness as that of the die pad 4d or the lead 4a, and as shown in FIG. 38, and may be exposed from the lower surface 6b of the sealing body 6.

Further, on the lower surface 4db of the die pad 4d and the lower surface 4ab of each lead 4a exposed at the lower surface 6b of the sealing body 6, as shown in FIG. 4, there is formed an exterior plating (plating film, plating layer) 8. Incidentally, in the case of the structure in which the end of each suspension lead 4c is exposed from the lower surface 6b of the sealing body 6 as described above, the exterior plating 8 is also formed on the end (the exposed surface from the sealing body 6) of the suspension lead 4c. Further, at the upper surface (chip mounting surface) 4da of the die pad 4d and the upper surface (wire connecting surface) 4aa of the lead 4a each to be connected with the wire 5, a plating layer not shown is formed, thereby to enhance the connectivity with the wire 5.

<Semiconductor Chip>

Then, the detailed configuration of each semiconductor chip will be described below.

First, the logic chip 1 has, as shown in FIG. 3, a front surface (main surface) 1a formed in a tetragonal shape in plan configuration of FIG. 4, a pad group 1d including a plurality of pads (electrodes or bonding pads) 1c formed along sides of the front surface 1a, and a back surface 1b shown in FIG. 4 opposite to the front surface 1a, and has a thickness of, for example, 150 µm. Further, as shown in FIG. 4, the logic chip 1 is mounted (stacked) over the upper surface 4da of the die pad 4d via the memory chip 3 so that the back surface 1b faces to the upper surface 4da of the die pad 4d, and so that sides of the front surface 1a extend in parallel with (along) sides of the upper surface 4da of the die pad 4d in a plan view (see FIG. 3), respectively. In addition, the logic chip 1 is arranged (mounted) at the central part of the die pad 4d in the plan view.

Incidentally, the plurality of pads 1c (pad group 1d) included in the logic chip 1 include pads 1c to be electrically connected to the leads 4a, and down bonding pads 1c to be electrically connected to the die pad 4d.

Further, the logic chip 1 is arranged at the central part of the die pad 4d in a plan view. This means as follows: as shown in FIG. 5, the logic chip 1 is arranged over the upper surface 4da of the die pad 4d so that a first region 1e surrounded by the plurality of pads 1c formed along sides of the logic chip 1 overlaps a point P of intersection between respective extension lines U of the plurality of suspension leads 4c for supporting the die pad 4d in the plan view.

Then, the power source IC chip 2 has, as shown in FIG. 3, a front surface (main surface) 2a of FIG. 4 having a shape in a plan view comprised of quadrangule, a pad group 2d including a plurality of pads (electrodes or bonding pads) 2c formed along sides of the front surface 2a, and a back surface 2b opposite to the front surface 1a, and has a thickness of, for example, 150 µm. Further, as shown in FIG. 4, the power source IC chip 2 is arranged (mounted) over the upper surface 4da of the die pad 4d so that the back surface 2b faces to the upper surface 4da of the die pad 4d, and arranged next to the logic chip 1 (at the corner part of the die pad 4d) in the plan view (see FIG. 3).

Incidentally, the plurality of pads 2c (pad group 2d) included in the power source IC chip 2 also include pads 2c to be electrically connected to the leads 4a, and down bonding pads 2c to be electrically connected to the die pad 4d.

Then, the memory chip 3 has, as shown in FIG. 3, a front surface (main surface) 3a of FIG. 4, a pad group 3d including a plurality of pads (electrodes or bonding pads) 3c formed at the front surface 3a, and a back surface 3b opposite to the front surface 3a, and has a thickness of, for example, 90 µm. Further, the memory chip 3 is arranged (mounted) over the upper surface 4da of the die pad 4d via the adhesive material 7 shown in FIG. 4 so that the back surface 3b faces to the upper surface 4da of the die pad 4d.

Incidentally, the plurality of pads 3c (pad group 3d) included in the memory chip 3 include pads 3c for establishing an electric connection between the chips, and down bonding pads 3c to be electrically connected to the die pad 4d.

Herein, the wires 5 in the QFN 9 will be described. The plurality of wires 5 are mainly classified into three types. Further, in the three types, there are the wires 5 different in loop height. First, the plurality of wires 5 are divided into the lead wires 5a for connecting the semiconductor chips to the leads 4a, down bonding wires 5b for connecting the semiconductor chips to the die pad 4d, and the inter-chip wires 5c for establishing a connection between the semiconductor chips.

Out of these, as the lead wires 5a, the wires 5 for connecting the logic chip 1 to the leads 4a have first lead wires 5aa, 5ab, and 5ac according to the loop height, and the wires 5 for connecting the power source IC chip 2 to the leads 4a are second lead wires 5ad.

Further, the down bonding wires 5b have first down bonding wires 5ba for connecting the logic chip 1 to the die pad 4d, second down bonding wires 5bb for connecting the power source IC chip 2 to the die pad 4d, and third down bonding wires 5bc for connecting the memory chip 3 to the die pad 4d.

Further, the inter-chip wires 5c have inter-chip wires 5ca for connecting the logic chip 1 to the power source IC chip 2, and inter-chip wires 5cb for connecting the logic chip 1 to the memory chip 3.

Incidentally, as shown in FIG. 5, there is included a first down bonding wire group 5*bd* including a plurality of first down bonding wires 5*ba* for electrically connecting the plurality of pads 1*c* (pad group 1*d*) of the logic chip 1, and a plurality of their corresponding down bonding regions 4*dc* of the die pad 4*d*, respectively.

Further, in the QFN 9, as shown in FIG. 3, there are arranged first lead wires 5*ab*1 each connected to the lead 4*a* from the logic chip 1 beyond the power source IC chip 2.

Incidentally, to the lead 4*a* to which each first lead wire 5*ab*1 is connected, there is also connected a second lead wire 5*ad*1 connected at one end thereof to the pad 2*c* of the power source IC chip 2.

This is as follows: power sources for clock are supplied to the logic chip 1 and the power source IC chip 2, and both are at the same power source potential. Fort this reason, the lead 4*a* for use therein is shared in common, thereby to reduce the number of the leads 4*a*.

Incidentally, as a means for reducing the number of the leads 4*a*, it is also conceivable that a power source potential for clock is supplied via the power source IC chip 2 to the logic chip 1. However, a noise tends to be present on the path. For this reason, the connection to the lead 4*a* is achieved by using different wires 5.

Therefore, in the QFN 9 of the present embodiment, there is present the wire 5 (first lead wire 5*ab*1) connected from the logic chip 1 to the lead 4*a* beyond the power source IC chip 2.

Then, a description will be given to the basic concept of the chip layout over the die pad 4*d* of the QFN 9 of the present embodiment shown in FIGS. 5 and 6. Incidentally, FIGS. 5 and 6 each clearly show the chip layout mainly over the die pad 4*d*. For this reason, for the wires 5, the wires 5*b* to be connected to the die pad 4*d* are shown in only a minimum necessary number for description.

First, the length of one side (the short side when the front surface 2*a* is formed in a rectangular shape in plan configuration) of the front surface 2*a* of the power source IC chip 2 is assumed to be L2. Then, the length (L2) is larger than the distance (LD) between the first down bonding region 4*dd* of the plurality of down bonding regions 4*dc* of the die pad 4*d* and the first side 4*de* of a plurality of sides of the upper surface 4*da* of the die pad 4*d* closest to the first down bonding region 4*dd* (L2>LD). Incidentally, when the front surface 2*a* of the power source IC chip 2 is formed in a square shape in plan configuration, the length of one side of the four sides is assumed to be L2.

Further, the power source IC chip 2 is arranged at a corner part region 4*dj* between the first down bonding region 4*dd* arranged along the first side 4*de* of the die pad 4*d*, and a second down bonding region 4*di* arranged along a second side 4*df* crossing with the first side 4*de* in a plan view.

In other words, the logic chip 1 and the power source IC chip 2 are mounted so that the relationship of L2>LD holds for any side of the logic chip 1.

As a result, in the QFN 9 of the present embodiment, the logic chip 1 stacked over the memory chip 3 is arranged at the central part of the die pad 4*d* in a plan view. On the other hand, the power source IC chip 2 is arranged at the corner part region 4*dj* of the die pad 4*d* in the plan view.

Herein, the chip layout in the QFN 9 will be described in details.

In the QFN 9, in order to strengthen the power source (e.g., reference potential) of the logic chip 1, along sides of the front surface 1*a* of the logic chip 1, there are formed power source (reference potential) electrodes (bonding pads 1*c*). For this reason, the wires (first down bonding wires 5*ba*) to be connected to the power source electrodes are connected (down bonded) to the periphery of the logic chip 1 (mainly the region next to each side of the logic chip 1 in a plan view), in the upper surface (chip mounting surface) 4*da* of the die pad 4*d*. Accordingly, in the plan view, the logic chip 1 is arranged (mounted) at roughly the central part in the upper surface 4*da* of the die pad 4*d*.

The arrangement place of the logic chip 1 will be described in details. The logic chip 1 is mounted over the upper surface of the die pad 4*d* so that the central part (the first region 1*e* surrounded by the plurality of pads 1*c* formed along respective sides) of the logic chip 1 overlaps the point P of intersection between respective extension lines U of the plurality of suspension leads 4*c* for supporting respective corner parts of the die pad 4*d* in a plan view.

In other words, first, the gap between a phantom line K1 defined by bonding the portions to which the first down bonding wires 5*ba* are connected (down bonding points) in the die pad (tab) 4*d*, and the first side 4*de* most adjacent to the phantom line K1 of the four sides of the upper surface (chip mounting surface) 4*da* of the die pad 4*d* having a shape in a plan view comprised of quadrangule is assumed to be L1. The gap L1 is also the length (distance) on a phantom line K2 orthogonal to the phantom line K1.

Then, the shortest side (each side for a square, or the short side for a rectangle) of the sides of the front surface 2*a* of the power source IC chip 2 arranged (mounted) next to the logic chip 1 in a plan view is assumed to be L2. Further, the distance between a phantom line K3 (a phantom line extending in the direction along the first direction X) defined by bonding the down bonding points of a plurality of first down bonding wires 5*be* to be connected to the second down bonding region 4*di* arranged on the fourth side 4*dh* side of the die pad 4*d* opposite to the second side 4*df*, and the fourth side 4*dh* is assumed to be L3. Then, the relationship of L3<L1<L2 holds.

Then, the logic chip 1 is arranged at the position such that the distance (gap) L1 is smaller (shorter) than the length L2 at any side of the die pad 4*d* (or the logic chip 1). For this reason, it becomes difficult to arrange (mount) the power source IC chip 2 between the side if of the logic chip 1 and the first side 4*de* of the die pad 4*d*, briefly, between the phantom line K1 (the phantom line extending in the direction along the second direction Y) connecting respective down bonding points of the plurality of first down bonding wires 5*ba* to be electrically connected to the logic chip 1 and the adjacent side (first side 4*de*) of the die pad 4*d* parallel to the phantom line K1.

Thus, in the QFN 9 of the present embodiment, the power source IC chip 2 arranged next the logic chip 1 in a plan view is arranged in the corner part region 4*dj* of the die pad 4*d* (the region between the first down bonding region 4*dd* arranged along the first side 4*de* and the second down bonding region 4*di* arranged along the second side 4*df* of the die pad 4*d*) in the plan view. As a result, it is possible to reduce the outer size of the die pad 4*d* (particularly, the upper surface 4*da*). In other words, it is possible to reduce the distance (gap) between each side of the die pad 4*d* and each side of the logic chip 1 in the plan view. As a result, it is possible to reduce the size of the QFN 9.

Namely, it is possible to reduce the size of the QFN (semiconductor device) 9 in which a plurality of semiconductor chips are incorporated while strengthening the power source of the logic chip 1.

Incidentally, as another measure for the foregoing problem (that down bonding is performed for four sides while mounting a plurality of semiconductor chips), it is conceivable that the outer size of the die pad 4*d* is increased. However, the reasons why it is difficult to increase the outer size of the die pad include the following, other than the foregoing reasons.

Namely, in the case of the structure in which the lower surface 4*db* of the die pad 4*d* is exposed from the sealing body 6 (so-called, a tab exposed structure (die pad exposed structure)), a large electrode (land) is also required to be arranged according to the die pad 4*d* in the mounting substrate (mother board) on which a finished semiconductor device is mounted.

Thus, the present inventors conducted a study on the following configuration: the outer size of the upper surface (chip mounting surface) 4*da* of the die pad 4*d* is set larger than that of the lower surface (mounting surface) 4*db* of the die pad 4*d*, namely, the width (the length in the direction crossing with the side of the die pad 4*d*) of the jutting part (a step part 4*f* of FIG. 10 described later) formed at the peripheral part is further increased. However, it was found that in a resin sealing step described later, a resin becomes less likely to be supplied to under the step part 4*f*.

In other words, for a semiconductor device in which the die pad 4*d* has a large restriction on the size of the upper surface 4*da* thereof, and down bonding is performed throughout the four sides thereof, as with the QFN 9 of the present embodiment, there is adopted the chip layout in which the logic chip 1 is arranged at the central part of the die pad 4*d*, and the power source IC chip 2 is arranged in the corner part region 4*dj* in a plan view. This is very effective for reducing the size of the QFN 9. Particularly, for the QFN 9 of the tab exposed structure, the effects resulting from the even balance with the mounting conditions are also very large.

Then, by reference to FIGS. 5 and 6, the chip layout (the corner part region of the die pad 4*d* in which the power source IC chip 2 is arranged) in the QFN 9 of the present embodiment will be described in another expression.

As shown in FIG. 5, the front surface 1*a* of the logic chip 1 has a pair of sides 1*f*, a pair of sides 1*g* crossing with the sides 1*f*, and corner parts 1*h* at the intersections between the sides 1*f* and the sides 1*g*. Further, a plurality of down bonding wires 5*b* have a plurality of first down bonding wires 5*ba* formed along the sides 1*f* of the logic chip 1, and a plurality of first down bonding wires 5*be* formed along the sides 1*g* of the logic chip 1.

Further, the plurality of first down bonding wires 5*ba* have the adjacent wire W1 closest to the corner part 1*h* of the logic chip 1 than other first down bonding wires 5*ba*. On the other hand, the plurality of first down bonding wires 5*be* have the adjacent wire W2 closest to the corner part 1*h* of the logic chip 1 than other first down bonding wires 5*be*.

Further, the die pad 4*d* has, as shown in FIG. 5, a third side 4*dg* facing to the first side 4*de*, and a fourth side 4*dh* facing to the second side 4*df*. Still further, the die pad 4*d* has a corner part 4*e* closest to the corner part 1*h* of the logic chip 1 than to other corner parts. The power source IC chip 2 is arranged in a region Q surrounded by the corner part 1*h* of the logic chip 1, the corner part 4*e* of the die pad 4*d*, the adjacent wire W1, and the adjacent wire W2 in a plan view.

Incidentally, in the die pad 4*d*, respective down bonding points connected with the two adjacent wires W1 and W2 are arranged within the width (one side if or side 1*g*) of the logic chip 1. Herein, the term "within the width" means within a region R on the die pad 4*d* interposed between respective extension lines S (see FIG. 6) of the two sides 1*g* joined to the opposite ends of the side if of the logic chip 1 crossing with the adjacent wire W1 (or the adjacent wire W2) in a plan view.

However, when the outer size of the power source IC chip 2 is small, the adjacent wires W1 and W2 are not required to be arranged within the width of the logic chip 1. Namely, the adjacent wire W1 or W2 may be connected to the corner part in the upper surface 4*da* of the die pad 4*d*.

Further, as shown in FIG. 5, the power source IC chip 2 is mounted (arranged) over the upper surface 4*da* of the die pad 4*d* so that the second region 2*e* surrounded by the plurality of pads 2*c* formed along a plurality of sides of the front surface 2*a* overlaps a part of either of the two diagonal lines T of the upper surface 4*da* of the die pad 4*d* (the diagonal lines T of the sealing body 6, or the extension lines U of the suspension leads 4*c*) in a plan view. However, when the upper surface 4*da* of the die pad 4*d* has a relatively large area, the second region 2*e* of the power source IC chip 2 is not necessarily required to be mounted so as to overlap with a part of either of the two diagonal lines T of the upper surface 4*da* of the die pad 4*d* (the diagonal lines T of the sealing body 6, or the extension lines U of the suspension leads 4*c*).

Incidentally, even in the case where the relationship of L1<L2 holds where L1 denotes the gap between the phantom line K1 and the first side 4*de*, and L2 denotes the length of the short side of the power source IC chip 2, when the gap between the logic chip 1 and the first side 4*de* of the die pad 4*d* is larger than the short side L2 of the power source IC chip 2, as shown in FIG. 6, a part of the power source IC chip 2 may be arranged between the logic chip 1 and the first side 4*de* of the upper surface 4*da* of the die pad 4*d* in a plan view.

Also in this case, the power source IC chip 2 is mounted (arranged) over the upper surface 4*da* of the die pad 4*d* so that the second region 2*e* (see FIG. 5) surrounded by the plurality of pads 2*c* formed along the plurality of sides of the front surface 2*a* overlaps a part of either of the two diagonal lines T of the upper surface 4*da* of the die pad 4*d* (the diagonal lines T of the sealing body 6, or the extension lines U of the suspension leads 4*c*) in a plan view.

By thus arranging the power source IC chip 2 arranged next to the logic chip 1 in the region Q surrounded by the corner part 1*h* of the logic chip 1, the corner part 4*e* of the die pad 4*d*, the adjacent wire W1, and the adjacent wire W2 in a plan view, it is possible to reduce the size of the QFN 9 including a plurality of semiconductor chips mounted therein.

Incidentally, in the QFN 9, each lead 4*a* and suspension lead 4*c*, and the die pad 4*d* are each formed of, for example, a copper alloy, and may be formed of an iron-nickel alloy or the like other than a copper alloy. Further, each wire 5 is, for example, a gold line (gold wire). Further, the sealing body 6 is formed of, for example, a sealing resin such as an epoxy type resin.

<Manufacturing Method of Semiconductor Device>

Then, a description will be given to a manufacturing method of the QFN (semiconductor device) 9 of the present embodiment.

Figure 7:
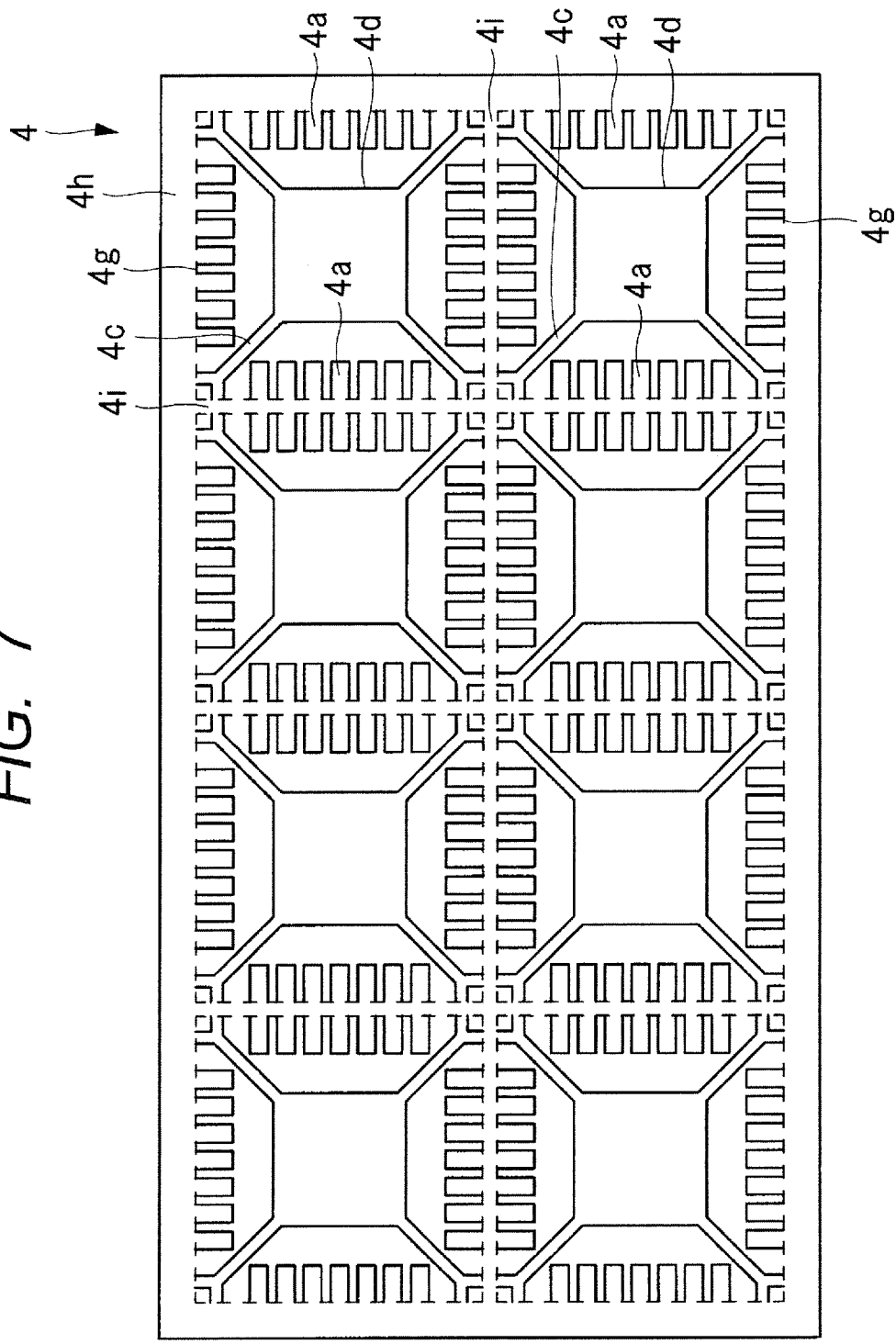
FIG. 7 is a plan view of a base material (lead frame) for use in manufacturing of the semiconductor device of the embodiment.
Figure 8:
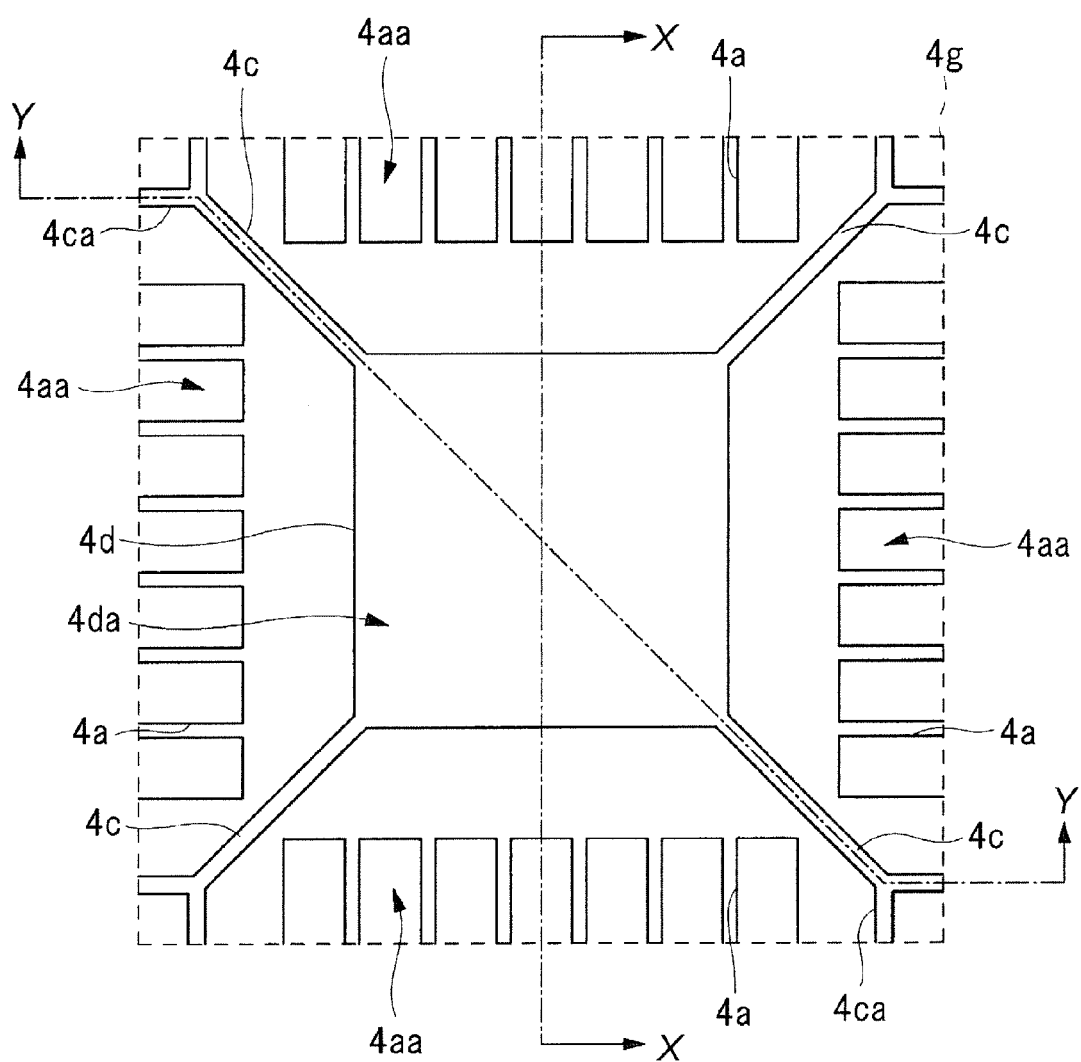
FIG. 8 is a plan view of the upper surface (chip mounting surface) side in one device region of the base material shown in FIG. 7.
Figure 9:
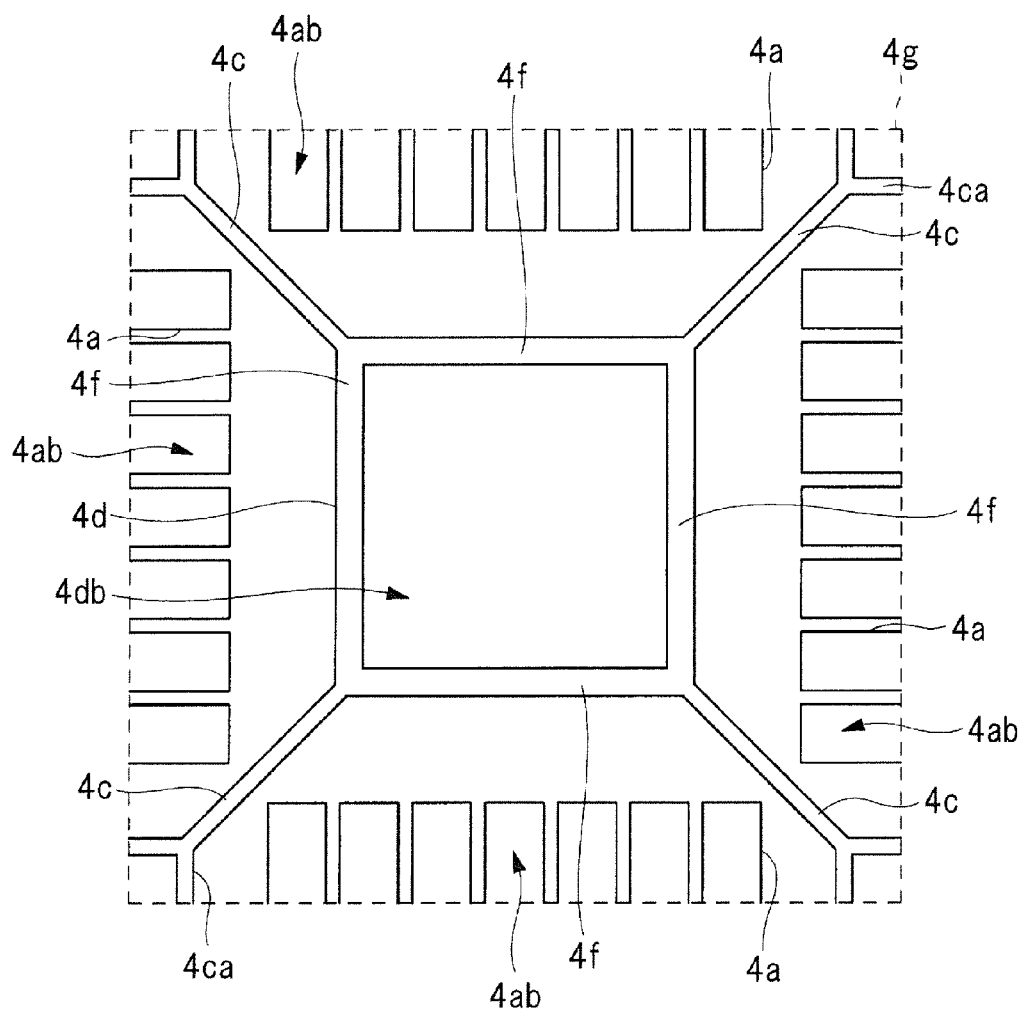
FIG. 9 is a plan view of the lower surface (mounting surface) side in one device region of the base material shown in FIG. 7.
Figure 10:
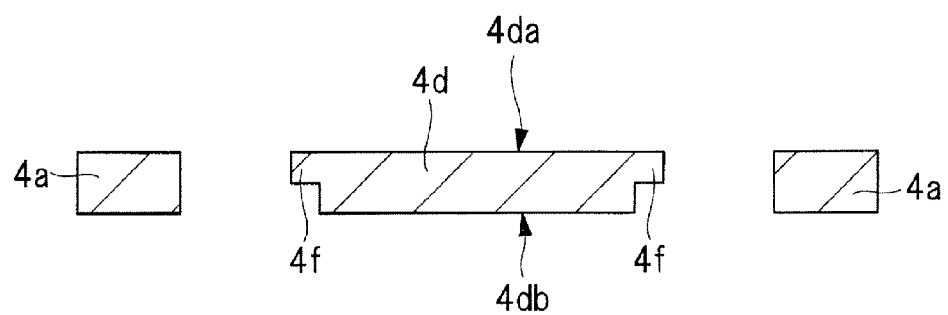
FIG. 10 is a cross-sectional view along line X-X shown in FIG. 8.
Figure 12:
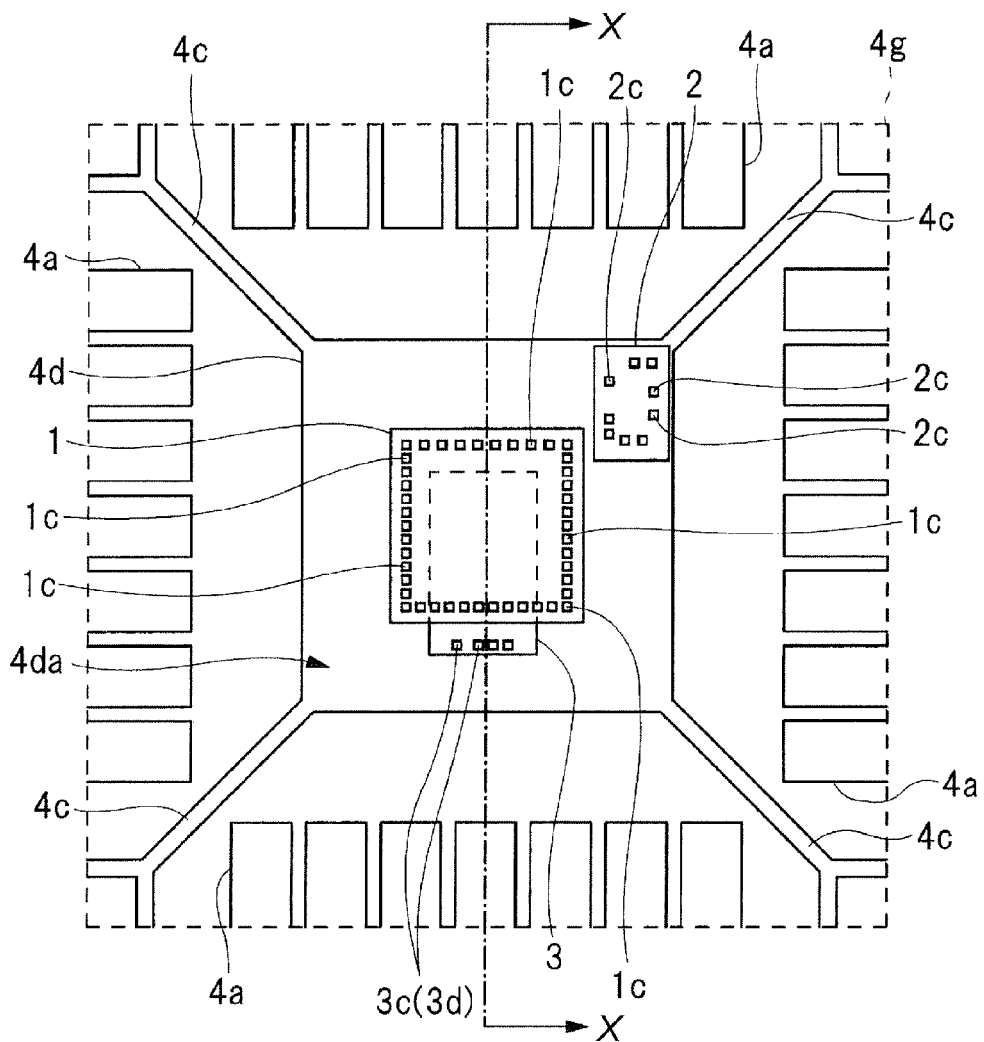
FIG. 12 is a plan view for illustrating the state after a die bonding step of the embodiment.
Figure 13:
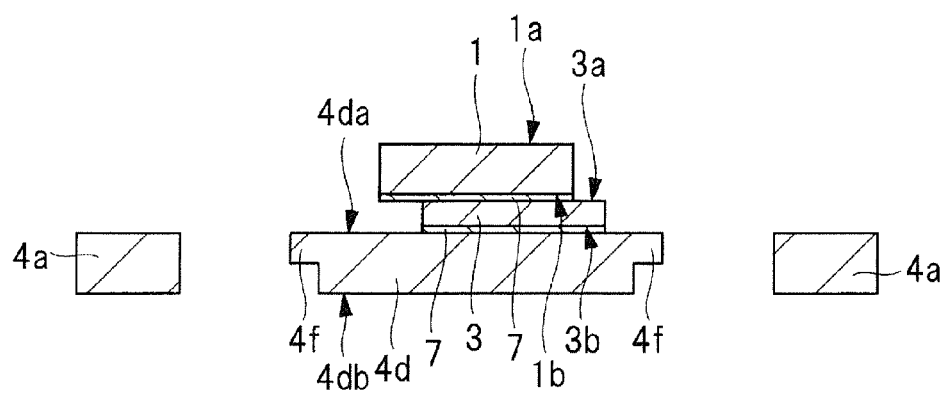
FIG. 13 is a cross-sectional view along line X-X shown in FIG. 12.
Figure 14:
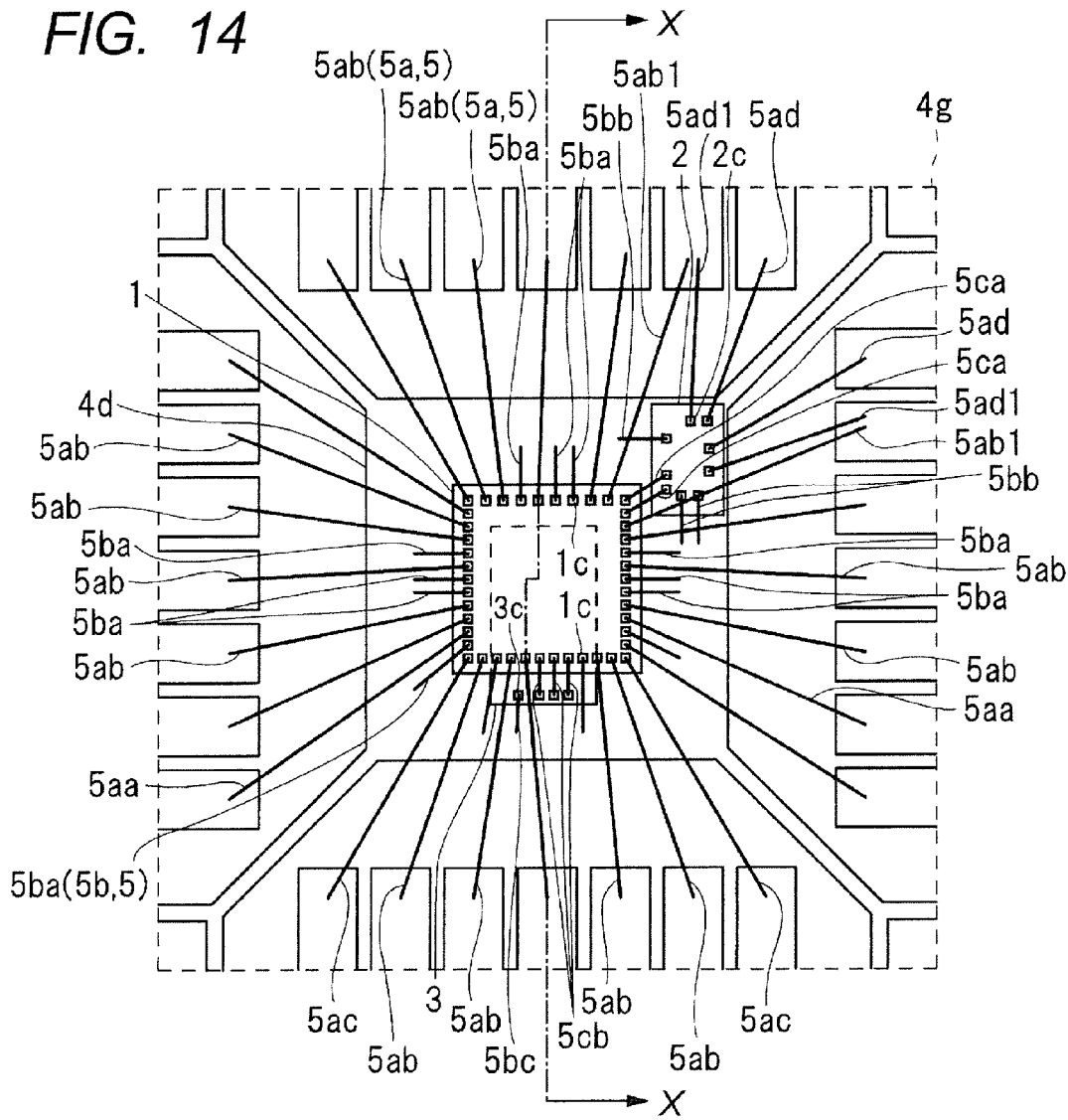
FIG. 14 is a plan view for illustrating the state after a wire bonding step of the embodiment.
Figure 15:
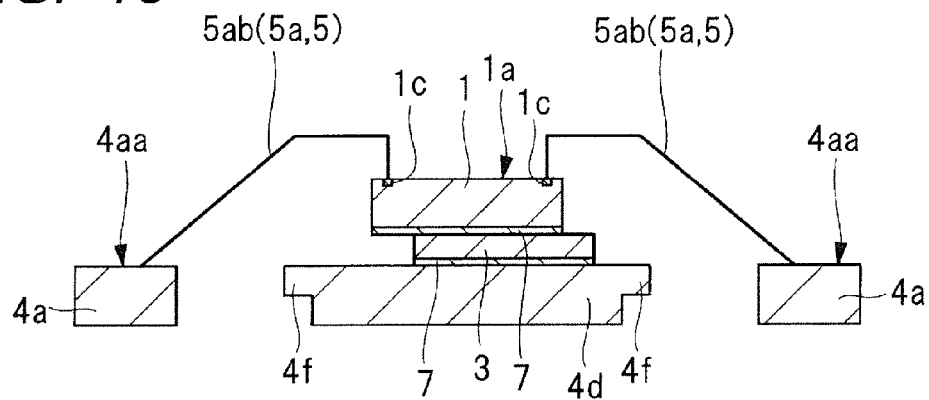
FIG. 15 is a cross-sectional view along line X-X shown in FIG. 14.

FIG. 7 is a plan view of a base material (lead frame) for use in manufacturing of the semiconductor device of the embodiment; FIG. 8 is a plan view of the upper surface (chip mounting surface) side in one device region of the base material shown in FIG. 7; FIG. 9 is a plan view of the lower surface (mounting surface) side in one device region of the base material shown in FIG. 7; FIG. 10 is a cross-sectional view along line X-X shown in FIG. 8; and FIG. 11 is a cross-sectional view along line Y-Y shown in FIG. 8. Further, FIG. 12 is a plan view for illustrating the state after a die bonding step of the embodiment; FIG. 13 is a cross-sectional view along line X-X shown in FIG. 12; FIG. 14 is a plan view for illustrating the state after a wire bonding step of the embodiment; and FIG. 15 is a cross-sectional view along line X-X shown in FIG. 14;

1. Lead Frame Provision

First, there is provided a thin plate-like lead frame (base material) 4 including a plurality of device regions 4*g* formed therein as shown in FIG. 7. Each device region 4*g* is a region in which one QFN 9 is formed. Herein, a description will be given to an assembly adopting a so-called batch molding method whereby the plurality of device regions 4g are collectively sealed by a resin. Incidentally, in each step, a description will be given by reference to a drawing covering only one device region 4g for convenience.

As shown in FIG. 8, in one device region 4g, there are formed one die pad (chip mounting part or tab) 4d, a plurality of suspension leads 4c for supporting the die pad 4d, and a plurality of leads 4a arranged next to (around) the die pad 4d, and arranged between the mutually adjacent suspension leads 4c of the plurality of suspension leads 4c. Namely, the die pad 4d is arranged between the plurality of leads 4a.

Thus, there is provided the lead frame 4 having a plurality of device regions 4g shown in FIG. 7.

Incidentally, each device region 4g is surrounded by a frame part 4h. Namely, the frame part 4h is arranged so as to surround the plurality of device regions 4g. The plurality of leads 4a and the plurality of suspension leads 4c are supported by the frame part 4h.

Further, in the lead frame 4, there is formed a dicing region 4i. The dicing region 4i is the region between the mutually adjacent device regions 4g in the lead frame 4, and is the region to be cut by a dicer after resin molding for singulation.

Further, as shown in FIG. 8, the end of each suspension lead 4c opposite to the end thereof on the die pad 4d side becomes a bifurcated branch part 4ca. Further, as shown in FIG. 11, in each suspension lead 4c, the region between the die pad 4d and the branch part 4ca is formed with a smaller thickness than that of the die pad 4d or the lead 4a of FIG. 10 by half etching or the like.

Further, in the die pad 4d, as shown in FIGS. 9 to 11, a step part (jutting part) 4f is formed in such a manner that the thickness of the peripheral part thereof is reduced. In the present embodiment, the peripheral part of the lower surface 4db of the die pad 4d is half etched. As a result, as shown in FIG. 9, the step part 4f is formed entirely over the peripheral part on the lower surface 4db side of the die pad 4d. As a result, in the die pad 4d, the upper surface (chip mounting surface) 4da protrudes from the lower surface 4db. Accordingly, the upper surface 4da is larger in area than the lower surface 4ab. This is effective for mounting a plurality of semiconductor chips.

Incidentally, as a part of the lead 4a, for example, the tip part facing to the die pad 4d may also be formed with a small thickness as with the die pad 4d.

Further, the step part 4f is formed by, for example, half etching, but may be formed by press processing.

Still further, each lead pattern of the lead frame 4 is formed by etching processing.

2. Die Bonding

Then, die bonding is performed. In the die bonding step, as shown in FIGS. 12 and 13, each semiconductor chip is mounted over the upper surface 4da of the die pad 4d via the adhesive material 7 which is a die bonding material. As the adhesive material 7, a film-like adhesive material 7 is preferably adopted, but a paste-like adhesive material 7 may be used.

In the present die bonding step, first, the power source IC chip 2 is mounted over the upper surface 4da of the die pad 4d. Then, the memory chip 3 is mounted thereover, and finally the logic chip 1 is mounted over the memory chip 3. At this step, the power source IC chip 2 is mounted within the corner part (region Q) of the upper surface 4da of the die pad 4d in a plan view shown in FIG. 6. Alternatively, the power source IC chip 2 is mounted (arranged) at the position in which the second region 2e thereof overlaps a part of either of the two diagonal lines T of the upper surface 4da of the die pad 4d (the diagonal lines T of the sealing body 6, or the extension lines U of the suspension leads 4c) in the plan view shown in FIG. 5.

Then, as shown in FIG. 12, the memory chip 3 is mounted at substantially the central part of the die pad 4d. Further, the logic chip 1 is mounted (stacked) over the memory chip 3.

At this step, the logic chip 1 is mounted so that the first region 1e overlaps the point P of intersection between respective extension lines U of the plurality of suspension leads 4c for supporting the die pad 4d in a plan view shown in FIG. 5. Further, as shown in FIGS. 12 and 13, the logic chip 1 is mounted so that a plurality of pads 3c (pad group 3d) of the underlying-stage memory chip 3 are exposed. Namely, the memory chip 3 is mounted in such a manner as to jut out from the upper-stage side logic chip 1 toward the side of the die pad 4d opposite to the side thereof on which the power source IC chip 2 is mounted. As a result, the plurality of pads 3c of the memory chip 3 are exposed from the logic chip 1.

However, the order of mounting of the three semiconductor chips may be as follows: first, the memory chip 3 is mounted, then, the power source IC chip 2 is mounted, and finally, the logic chip 1 is mounted.

3. Wire Bonding

Then, as shown in FIGS. 14 and 15, wire bonding is performed.

In the wire bonding step in the present embodiment, first, inter-chip connection is performed. Herein, each pad 1c of the logic chip 1 and each pad 3c of the memory chip 3 are electrically connected by a wire (inter-chip wire) 5cb. Each pad 1c of the logic chip 1 and each pad 2c of the power source IC chip 2 are electrically connected by a wire (inter-chip wire) 5ca. At this step, in the present embodiment, the logic chip 1 side is referred to as the first side of each wire. Each side of the power source IC chip 2 and the memory chip 3 is referred to as the second side of each wire. Namely, a part of the wire is connected to each pad 1c of the logic chip 1. Then, the other part of the wire is connected to each of the pads 2c and 3c on the power source IC chip 2 and memory chip 3 sides. Incidentally, in the present embodiment, a description has been given to the order in which the memory chip 3 and the logic chip 1 are connected, and then, the power source IC chip 2 and the logic chip 1 are connected. However, the following order is also acceptable; the power source IC chip 2 and the logic chip 1 are connected, and then, the memory chip 3 and the logic chip 1 are connected.

Then, down bonding of each semiconductor chip (wire bonding for electrically connecting the semiconductor chip to the die pad 4d) is performed. Herein, first, there is performed down bonding of the power source IC chip 2 and the memory chip 3. Namely, each pad 3c of the memory chip 3 and the die pad 4d are electrically connected by a second down bonding wire 5bb. Each pad 2c of the power source IC chip 2 and the die pad 4d are electrically connected via a third down bonding wire 5bc. Then, each pad 1c of the logic chip 1 and the die pad 4d are electrically connected via a first down bonding wire 5ba. Incidentally, in the present embodiment, a description has been given to the order in which the memory chip 3 and the die pad 4d are connected, and then, the power source IC chip 2 and the die pad 4d are connected. However, the following order is also acceptable: the power source IC chip 2 and the die pad 4d are connected, and then, the memory chip 3 and the die pad 4d are connected. At this step, in the present embodiment, each side of respective semiconductor chips 1, 2, and 3 is referred to as the first side of the wire. Each die pad 4d side is referred to as a second side of the wire. Namely, a part of the wire is connected to each of respective semiconductor chips 1, 2, and 3, and then, the other side of the wire is connected to the die pad 4d.

Incidentally, the tilt angle on the second side of the wire (the angle with respect to the surface to which the wire is connected) is smaller than the tilt angle on the first side of the wire. Accordingly, when the gap (distance) between the pad 3c to which the wire 5bc to be bonded with the die pad 4d is connected of the plurality of pads 3c and the pad 3c to which the wire 5cb to be bonded with the logic chip 1 is connected is small (close), after connecting the memory chip 3 to the die pad 4d, the logic chip 1 and the memory chip 3 are connected. As a result, a capillary (not shown) for use in the wire bonding step may come in contact with the wire 5bc, thereby to deform the wire 5bc. However, in the present embodiment, as described above, after connecting the logic chip 1 to the memory chip 3, the memory chip 3 and the die pad 4d are connected. For this reason, even when the gap (distance) from the pad 3c is small (close), the deformation of the wire can be suppressed.

Then, there is established a connection between the power source IC chip 2 and each lead 4a. Namely, each pad 2c of the power source IC chip 2 and its corresponding lead 4a are electrically connected via the second lead wire 5ad or the second lead wire 5ad1.

Then, a connection between the logic chip 1 and each lead 4a is established. Namely, the pads 1c of the logic chip 1 and their respective corresponding leads 4a are electrically connected via the first lead wires 5aa, 5ab, 5ab1, and 5ac. At this step, the first lead wires 5ac, 5ab, and 5aa are connected in this order from a lower loop height. Incidentally, the first the lead wire 5ab1 is allowed extend beyond the power source IC chip 2, and is connected to the same lead 4a as the lead 4a to which the second lead wire 5ad1 is connected (two sites in the example shown in FIG. 14).

As a result, the increasing order of the loop height between chip-lead 4a is: sequentially from the lower loop height, the second lead wire 5ad (5ad1), and the first lead wires 5ac, 5ab (5ab1), and 5aa.

4. Molding

Then, resin molding is performed.

Figure 16:
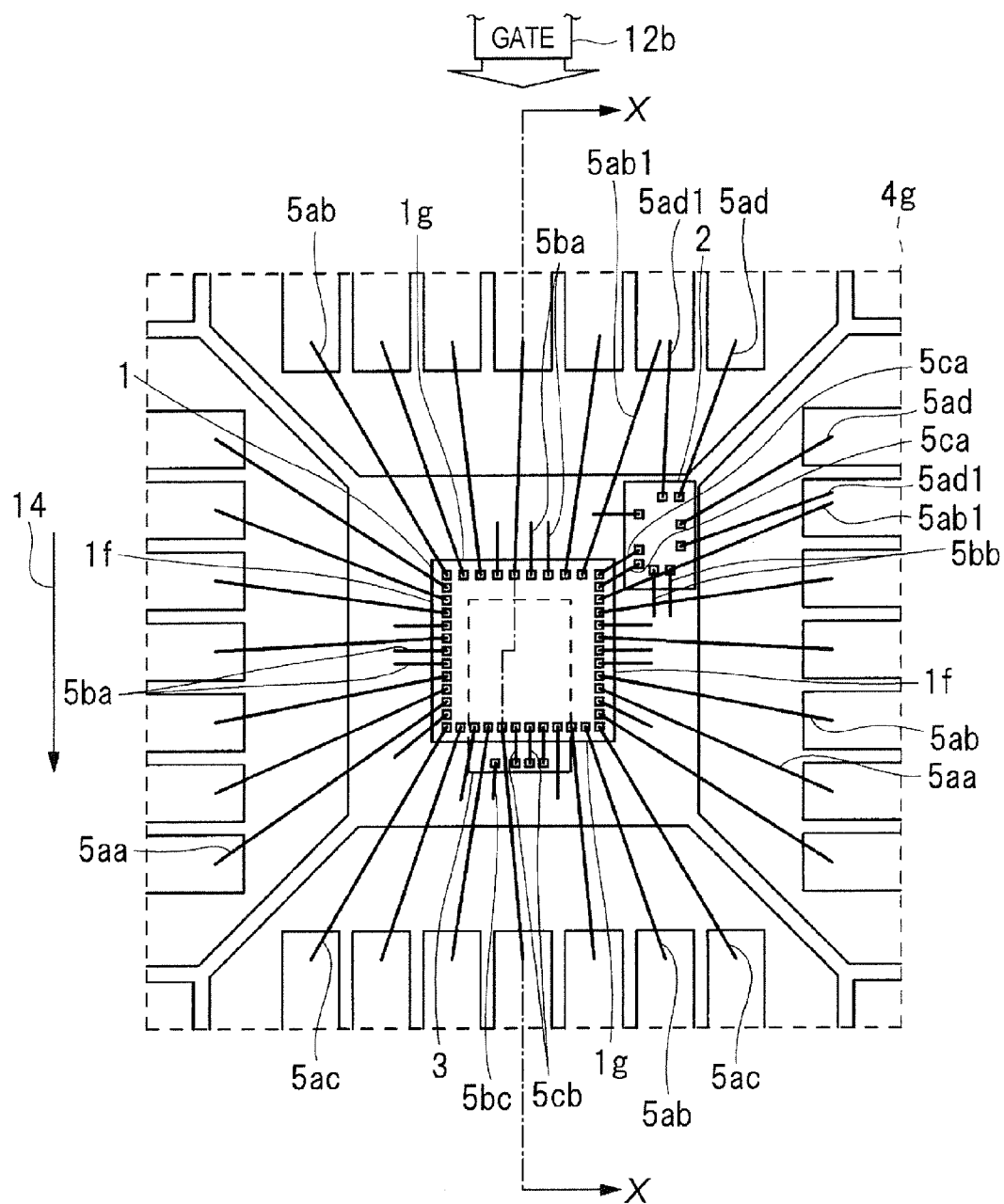
FIG. 16 is a plan view showing the position of a gate with respect to each device region in a molding (resin sealing) step of the embodiment.
Figure 17:
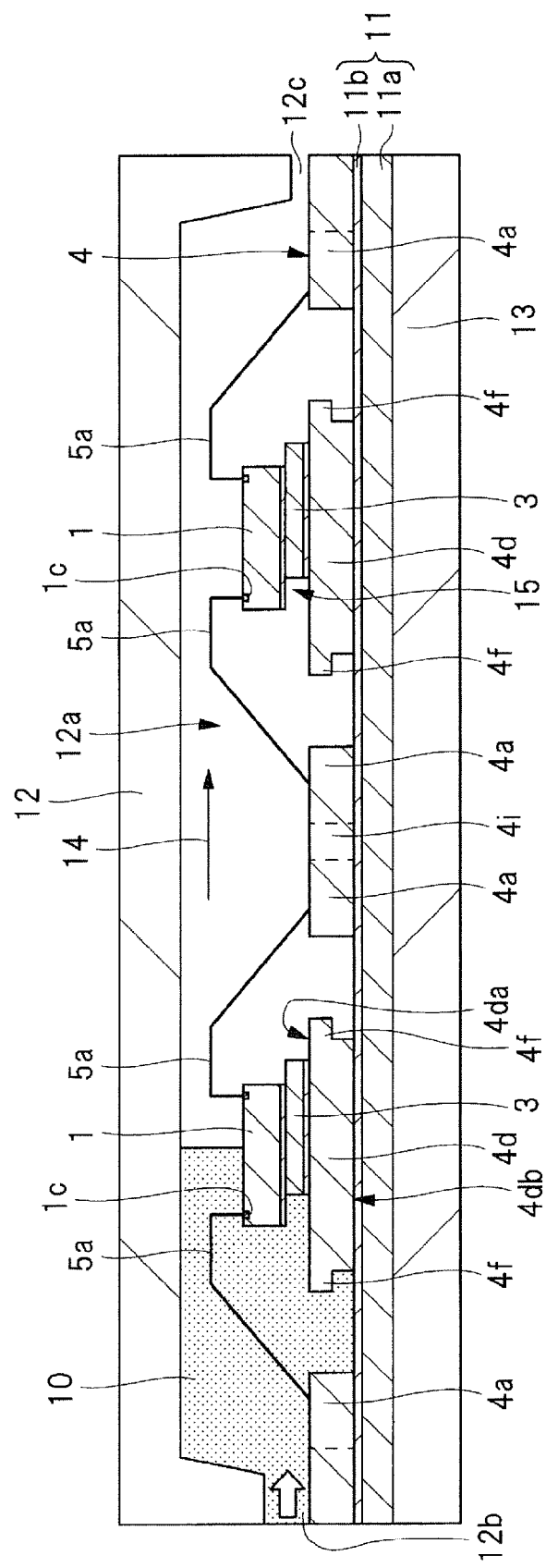
FIG. 17 is a cross-sectional view for illustrating the state in which a resin is supplied into a cavity including the base material shown in FIG. 16 arranged therein.
Figure 18:
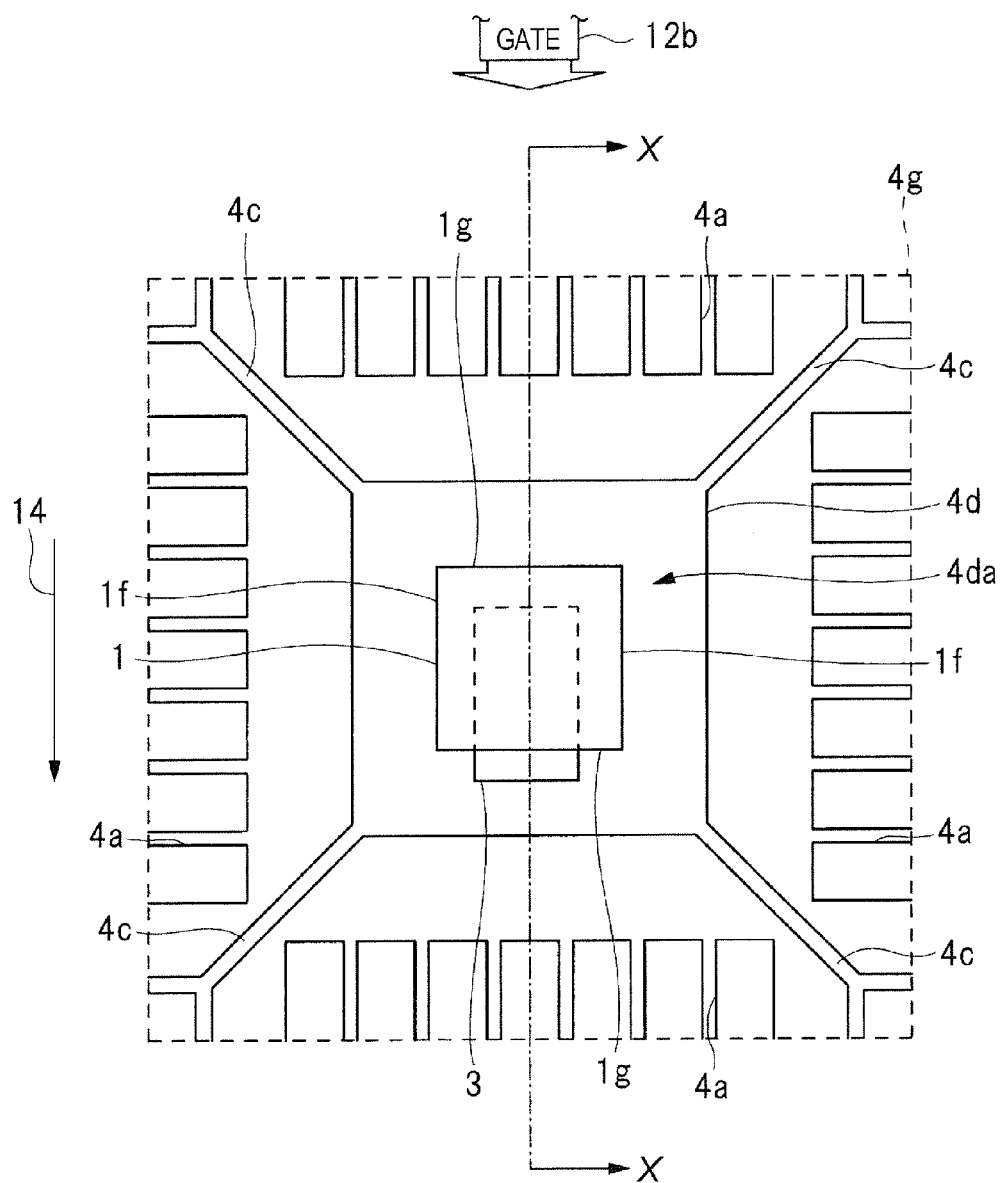
FIG. 18 is a plan view for illustrating the upper concept of the embodiment on the position of the gate with respect to the device region of the lead frame of FIG. 7.
Figure 19:
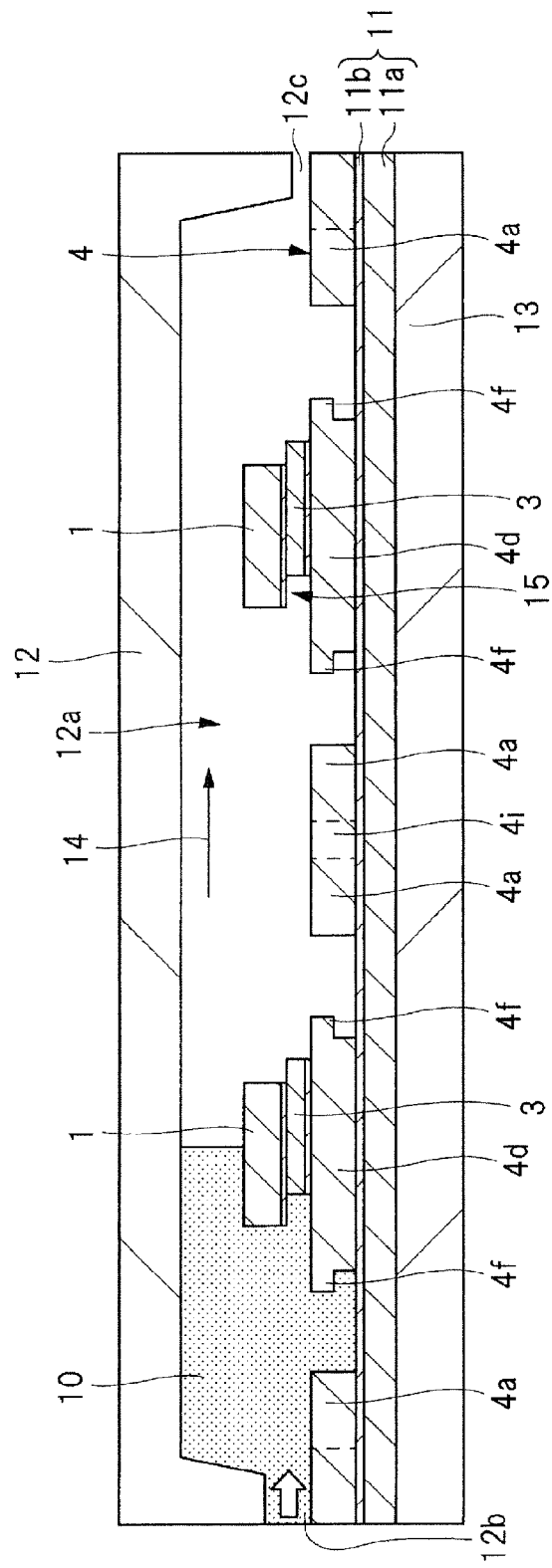
FIG. 19 is a cross-sectional view for illustrating the state in which a resin is supplied into a cavity including the base material shown in FIG. 18 is arranged.
Figure 20:
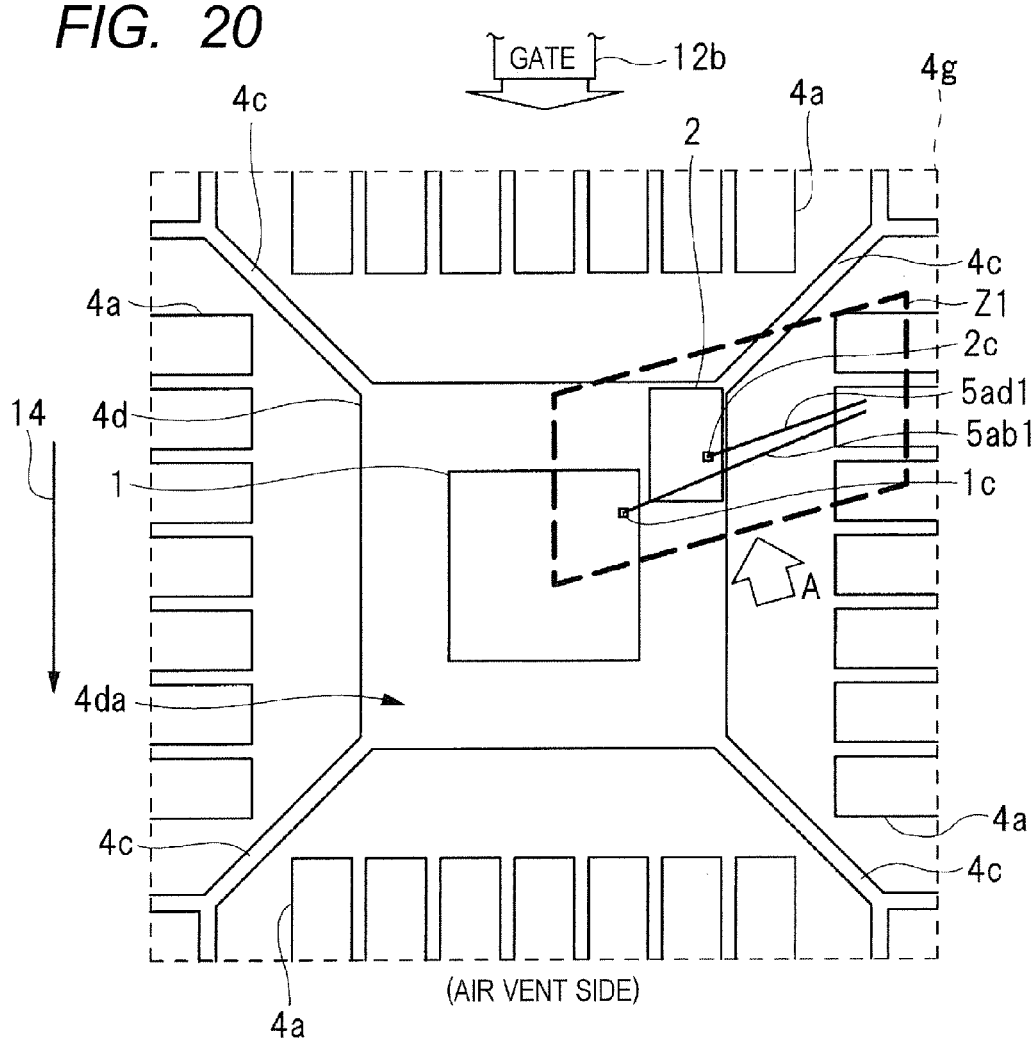
FIG. 20 is a plan view for illustrating the upper concept of the embodiment on the position of the gate with respect to the device region of the lead frame of FIG. 7.
Figure 21:
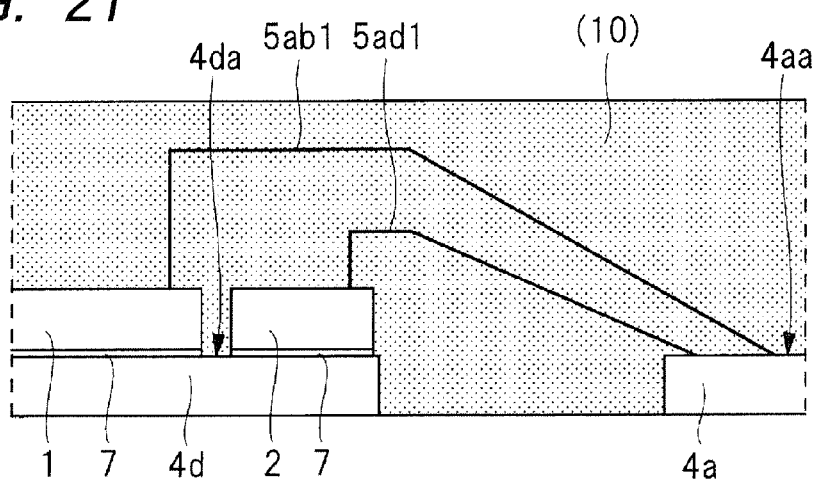
FIG. 21 is a conceptual view of a Z1 part of FIG. 20 as seen from the direction A.

FIG. 16 is a plan view showing the position of a gate with respect to each device region in a molding (resin sealing) step of the embodiment; FIG. 17 is a cross-sectional view for illustrating the state in which a resin is supplied into a cavity including the base material shown in FIG. 16 arranged therein; FIG. 18 is a plan view for illustrating the upper concept of the embodiment on the position of the gate with respect to the device region of the lead frame of FIG. 7; FIG. 19 is a cross-sectional view for illustrating the state in which a resin is supplied into a cavity including the base material shown in FIG. 18 is arranged; FIG. 20 is a plan view for illustrating the upper concept of the embodiment on the position of the gate with respect to the device region of the lead frame of FIG. 7; and FIG. 21 is a conceptual view of a Z1 part of FIG. 20 as seen from the direction A.

Figure 22:
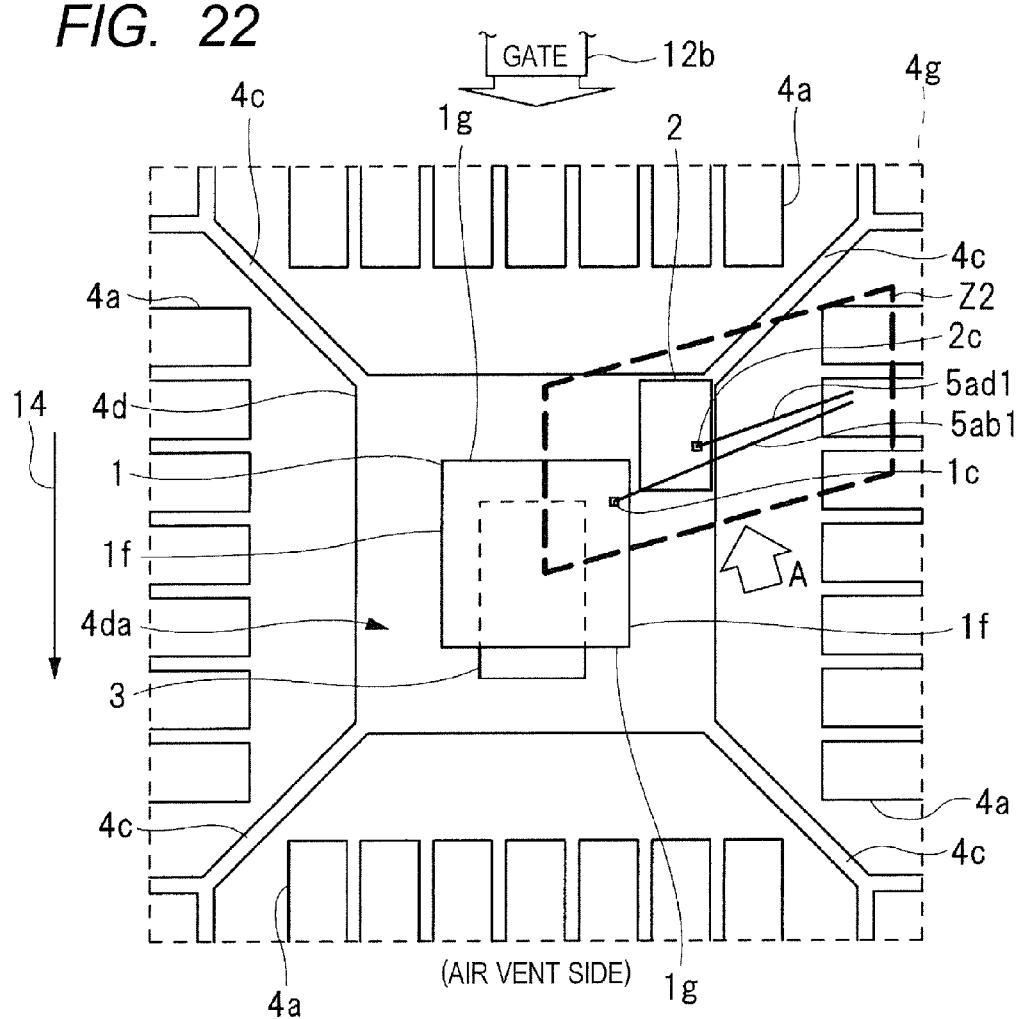
FIG. 22 is a plan view for illustrating the upper concept of the embodiment on the position of the gate with respect to the device region of the lead frame of FIG. 7.
Figure 23:
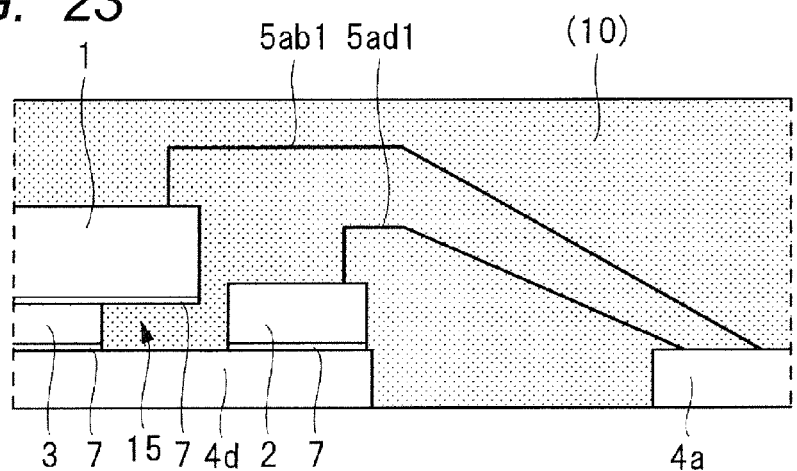
FIG. 23 is a conceptual view of a Z2 part of FIG. 22 as seen from the direction A.
Figure 24:
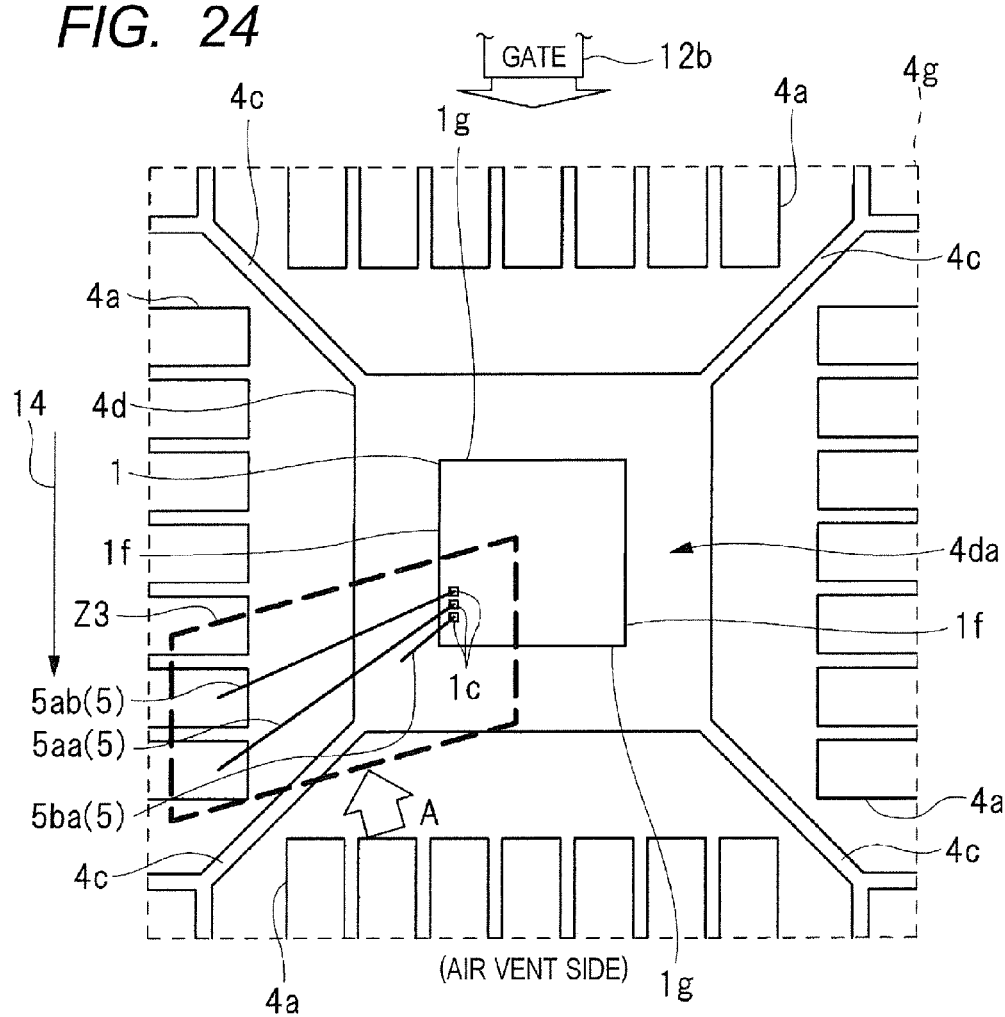
FIG. 24 is a plan view for illustrating the upper concept of the embodiment on the position of the gate with respect to the device region of the lead frame of FIG. 7.
Figure 25:
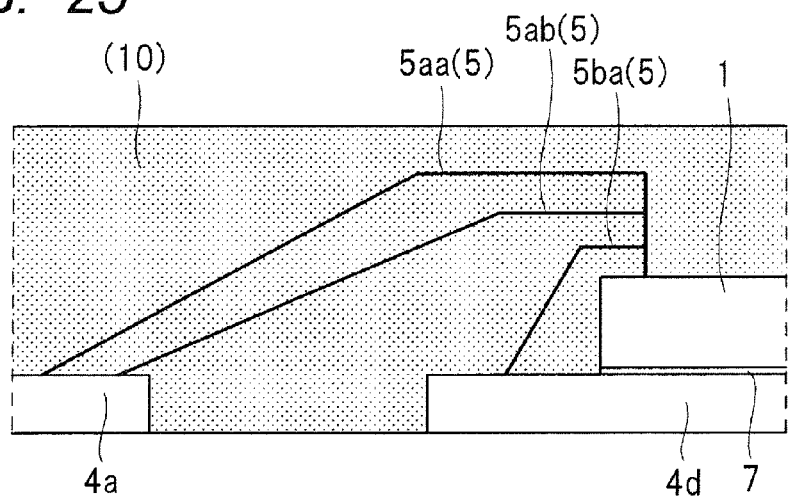
FIG. 25 is a conceptual view of a Z3 part of FIG. 24 as seen from the direction A.
Figure 26:
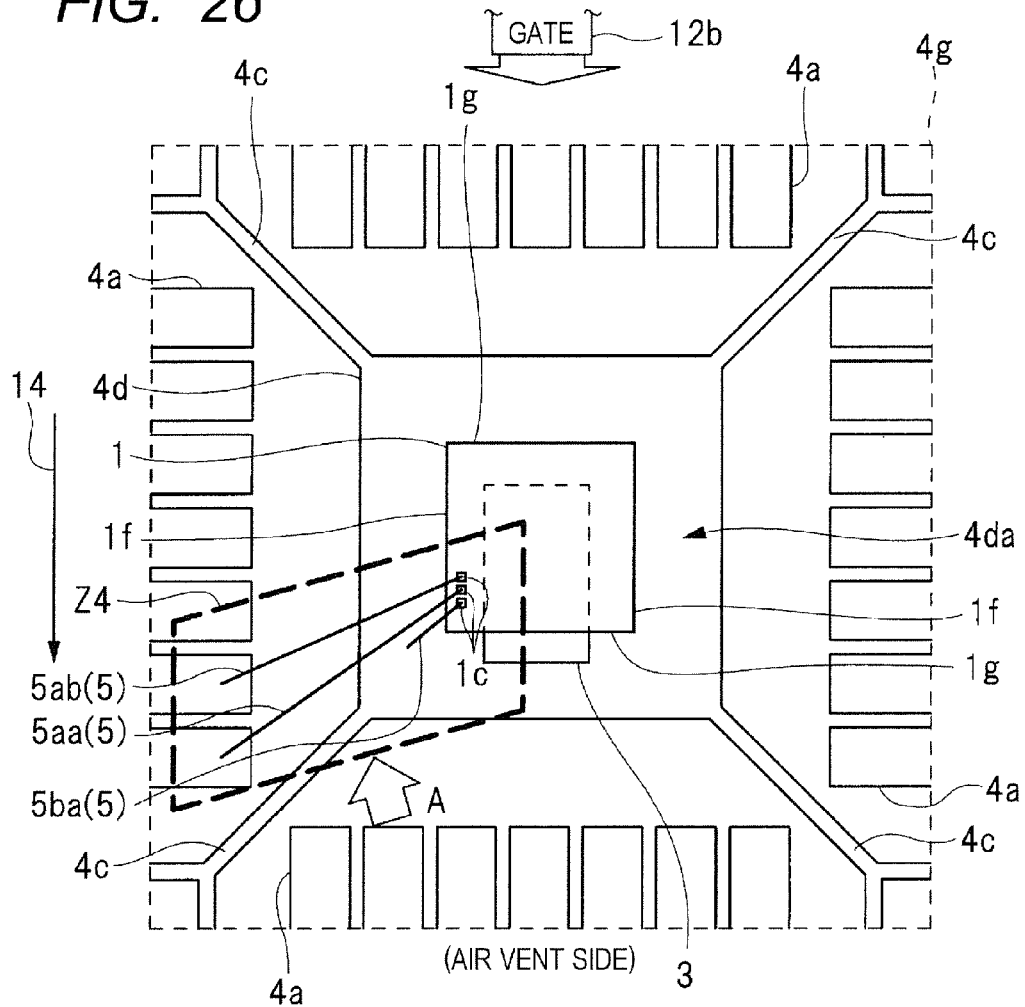
FIG. 26 is a plan view for illustrating the upper concept of the embodiment on the position of the gate with respect to the device region of the lead frame of FIG. 7.
Figure 27:
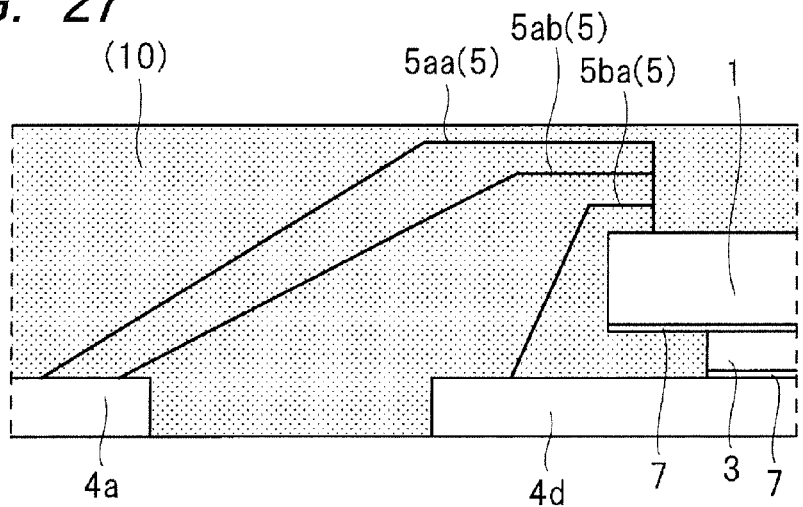
FIG. 27 is a conceptual view of a Z4 part of FIG. 26 as seen from the direction A.
Figure 28:
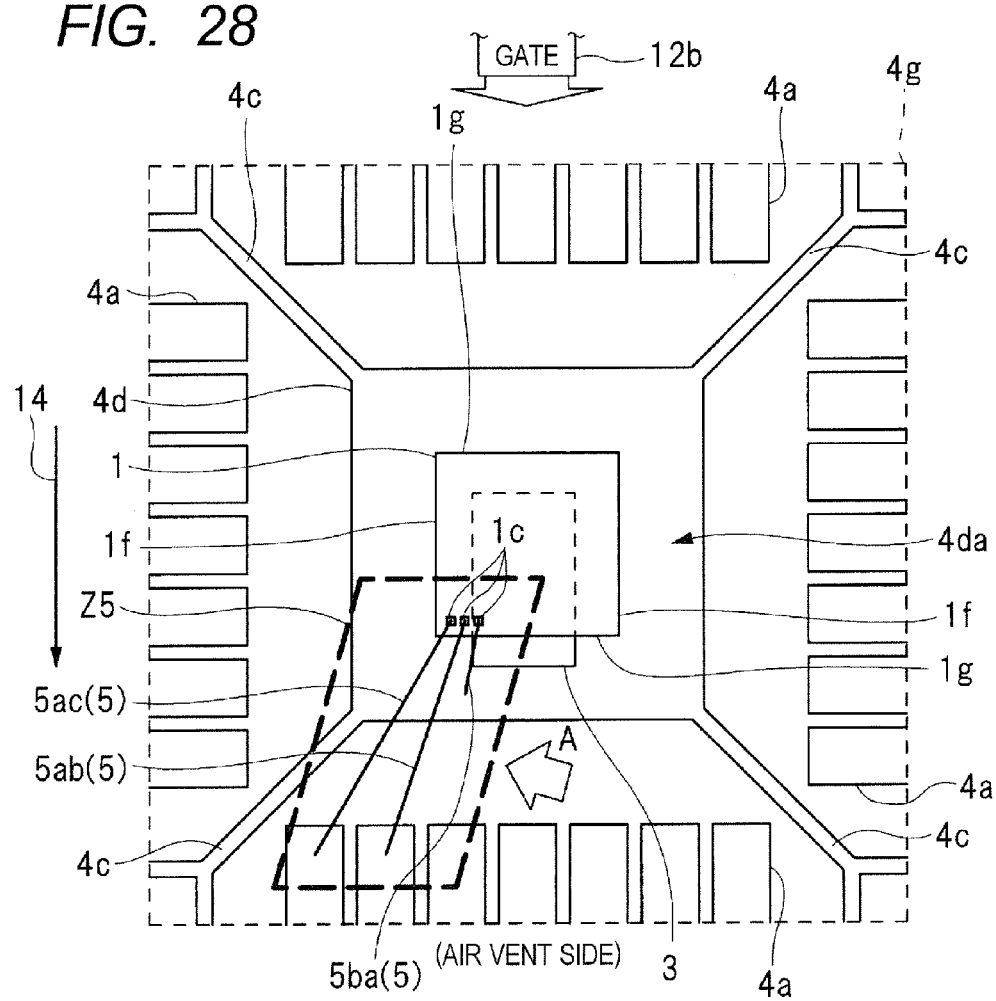
FIG. 28 is a plan view for illustrating the upper concept of the embodiment on the position of the gate with respect to the device region of the lead frame of FIG. 7.
Figure 29:
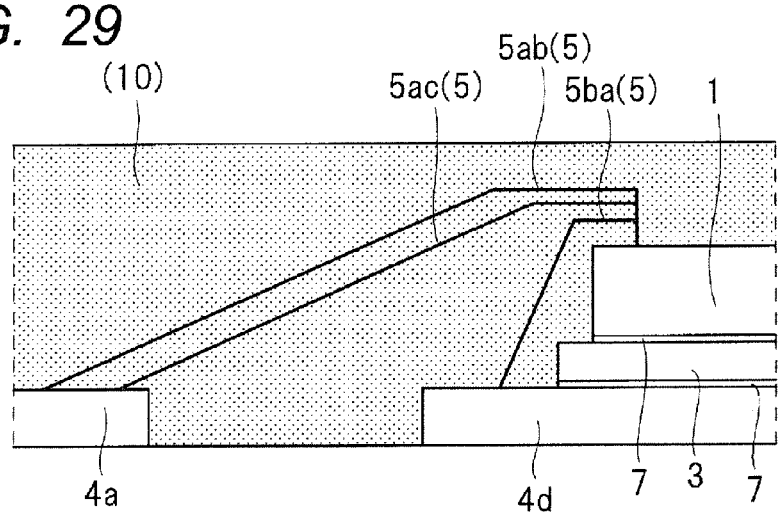
FIG. 29 is a conceptual view of a Z5 part of FIG. 28 as seen from the direction A.

Further, FIG. 22 is a plan view for illustrating the upper concept of the embodiment on the position of the gate with respect to the device region of the lead frame of FIG. 7; FIG. 23 is a conceptual view of a Z2 part of FIG. 22 as seen from the direction A; FIG. 24 is a plan view for illustrating the upper concept of the embodiment on the position of the gate with respect to the device region of the lead frame of FIG. 7; and FIG. 25 is a conceptual view of a Z3 part of FIG. 24 as seen from the direction A. FIG. 26 is a plan view for illustrating the upper concept of the embodiment on the position of the gate with respect to the device region of the lead frame of FIG. 7; FIG. 27 is a conceptual view of a Z4 part of FIG. 26 as seen from the direction A; FIG. 28 is a plan view for illustrating the upper concept of the embodiment on the position of the gate with respect to the device region of the lead frame of FIG. 7; and FIG. 29 is a conceptual view of a Z5 part of FIG. 28 as seen from the direction A.

In the present resin molding step, the three semiconductor chips (the logic chip 1, the power source IC chip 2, and the memory chip 3), and the plurality of wires 5 are sealed with a resin 10 shown in FIG. 17. At this step, the resin molding of the present embodiment is a batch molding system. For this reason, a plurality of semiconductor chips are arranged in one cavity. The plurality of semiconductor chips are collectively sealed with the resin 10.

Further, the QFN 9 is of the tab exposed type. Accordingly, as shown in FIGS. 16 and 17, the three semiconductor chips, the leads 4a, and a portion of the die pad 4d, and the plurality of wires 5 are sealed with the resin 10 so that respective lower surfaces 4ab of the plurality of leads 4a are exposed from the lower surface 6b of the sealing body 6 as shown in FIG. 2.

Further, in order to allow the lower surface 4db of the die pad 4d and the lower surface 4ab of each lead 4a to be exposed, as shown in FIG. 17, resin molding is performed with a tape 11 bonded to the lower surface of the lead frame 4 (the mounting surface, the lower surface 4db of the die pad 4d, and the lower surface 4ab of each lead 4a).

Incidentally, the tape 11 includes a base material (base material layer) 11a, and an adhesive layer 11b formed on the surface of the base material 11a, and inhibits the resin 10 from running onto the lower surface (mounting surface) 4db of the die pad 4d, and the lower surface (mounting surface) 4ab of the lead 4a during resin molding.

First, the lead frame 4 which has gone through the wire bonding step is arranged over a lower die 13 of a molding die including a pair of an upper die 12 and the lower die 13 so that the tape 11 is interposed between the lower die 13 and the lead frame 4.

At this step, as shown in FIGS. 16 and 17, the lead frame 4 is set over the lower die 13 so that a resin flow direction 14 is formed from the side of the die pad 4d on which the power source IC chip 2 is mounted toward the opposite side therefrom.

In other words, the lead frame 4 is set so that the resin 10 is supplied from the side 1g (the upper side of the logic chip 1 in FIG. 16) opposite to the side 1g from which the memory chip 3 juts out to form the resin flow direction 14.

After setting, the lower die 13 and the upper die 12 are clamped so that the cavity 12a of the upper die 12 covers the plurality of device regions 4g. Then, the resin 10 is supplied (injected) into the cavity 12a from the gate 12b toward the air vent 12c.

Incidentally, in the die pad 4d, the step part 4f with the upper surface (chip mounting surface) 4da protruding from the lower surface 4db is arranged at the peripheral part. Accordingly, the resin 10 runs to the step part 4f, resulting in the formation of the sealing body 6.

The formation of the step part 4f suppresses the area of the exposed lower surface 4db of the die pad 4d, which can improve the mounting conditions for amounting substrate. Further, the increase in area of the upper surface 4da produces an effect for mounting a plurality of semiconductor chips.

In the resin molding of the present embodiment, as shown in FIGS. 18 and 19, the resin 10 is supplied from the side of the side 1g of the logic chip 1 opposite to the side 1g from which the memory chip 3 juts out, thereby to form the resin flow direction 14. Therefore, the resin 10 can be filled in the gap 15 between the logic chip 1 and the die pad 4d formed by the configuration in which the upper-stage logic chip 1 juts out from the lower-stage memory chip 3 shown in FIG. 19.

Namely, the resin 10 flows toward the side on which the gap 15 opens. Accordingly, the resin 10 can be filled in the gap 15, which can reduce the occurrence of voids in the gap 15. This can provide the effect of reducing the void occurrence regardless of mounting or non-mounting of the power source IC chip 2, or whether the power source IC chip 2 is mounted or not mounted.

Then, FIG. 20 illustrates the countermeasure against the wire short circuit at a site (Z1 part) in which the logic chip 1 and the power source IC chip 2 are wire connected to the same lead 4a, and is a view targeted for the structure in which the logic chip 1 is directly mounted over the die pad 4d not via the semiconductor chip.

Incidentally, in the QFN 9, power sources for clock are supplied to the logic chip 1 and the power source IC chip 2, and both are at the same power source potential. Fort this reason, the lead 4a for use therein is shared in common, thereby to reduce the number of the leads 4a. Therefore, in the QFN 9, there is a first lead wire 5ab1 connected from the logic chip 1 to the lead 4a beyond (across) the power source IC chip 2. The first lead wire 5ab1 extends across the power source IC chip 2 as shown in FIG. 21. In addition, the upper surface (wire connecting surface) 4aa of the lead 4a to which the first lead wire 5ab1 is connected is arranged at the same height as that of the upper surface (chip mounting surface) 4da of the die pad 4d over which the logic chip 1 is mounted. Therefore, the wire length thereof is very long. Further, the height of the wire loop is set higher than that of the second lead wire 5ad1 connected to the same lead 4a.

Further, in the cavity 12a of the upper die 12 shown in FIG. 19, the filling pressure of the resin 10 on the gate 12b side is lower than the filling pressure of the resin 10 on the air vent 12c side. Therefore, in the resin molding step, the lead frame 4 is arranged in the cavity 12a of the upper die 12 so that the first lead wire 5ab1 is arranged on the gate 12b side as shown in FIG. 20. Thus, the resin 10 is supplied. In other words, the resin 10 is supplied from the side on which the first lead wire 5ab1 is arranged.

As a result, it is possible to suppress the occurrence of a wire short circuit due to the wire flow even at the site at which the first lead wire 5ab1 with a long wire length is arranged.

Further, FIG. 22 illustrates the countermeasure against a wire short circuit at a site (Z2 part) at which the logic chip 1 and the power source IC chip 2 are wire connected to the same lead 4a in the same manner as described above in the structure in which the logic chip 1 is stacked over the memory chip 3.

In the structure shown in FIG. 22, the logic chip 1 is stacked over the memory chip 3. Accordingly, as shown in FIG. 23, the connection point (the first bonding point in the present embodiment) between the logic chip 1 and the first lead wire 5ab1 is at a higher position than that of the connection point (the first bonding point in the present embodiment) between the power source IC chip 2 and the second lead wire 5ad1.

Therefore, as shown in FIG. 23, the wire length of the first lead wire 5ab1 is shorter than that of the first lead wire 5ab1 at the Z1 part of FIG. 20 (see FIG. 21). However, the wire flow still tends to occur. However, in the present embodiment, as shown in FIG. 22, the lead frame 4 is arranged in the cavity 12a of the upper die 12 so that the first lead wire 5ab1 is arranged on the gate 12b side. Thus, the resin 10 is supplied. Further, in the present embodiment, the height of the wire loop is set higher than that of the second lead wire 5ad1 connected to the same lead 4a. For this reason, it is possible to suppress the occurrence of a wire short circuit due to the wire flow.

Further, the resin 10 is supplied from the side of the side 1g of the logic chip 1 opposite to the side 1g from which the memory chip 3 juts out, thereby to form the resin flow direction 14. Therefore, the resin 10 can be filled in the gap 15 between the logic chip 1 and the die pad 4d, which can suppress the occurrence of voids in the gap 15.

Then, the structure shown in FIG. 24 shows the countermeasure against a wire short circuit on the air vent 12c side during resin molding, and is a view targeted for the structure in which the logic chip 1 is directly mounted on the die pad 4d not via the semiconductor chip, and other semiconductor chips than the logic chip 1 are not mounted.

Incidentally, during resin molding, in the cavity 12a of the upper die 12 shown in FIG. 19, on the air vent 12c side, the resin 10 is flowed from various directions. Further, on the air vent 12c side, curing of the resin 10 proceeds more than on the gate 12b side. Accordingly, the filling pressure of the resin 10 is higher. As a result, there occurs a problem that the wire 5 tends to be put down.

Thus, as shown in FIG. 25 (Z3 part of FIG. 24), a difference is caused in loop height between the mutually adjacent wires. This prevents the wires 5 from coming in contact with one another even when the wires 5 are put down.

Namely, a difference is caused in loop height between the wires 5 connected to the pads 1c arranged along the side 1f of the logic chip 1 (resin flow direction 14) of FIG. 24 as targets (the same also applies to the side 1f on the opposite side), particularly, between the wires 5 formed on the air vent 12c side as shown in FIG. 25. Specifically, the adjacent first lead wire 5aa and first lead wire 5ab to be connected to the mutually adjacent leads 4a are arranged so that the loop height of the first lead wire 5aa is set higher, and further, so that the difference in height from the first down bonding wire 5ba next to the first lead wire 5aa is as large as possible.

As a result, it is also possible to suppress the occurrence of a wire short circuit on the air vent 12c side on which wire flow tends to occur.

Further, FIG. 26 shows the countermeasure against a wire short circuit on the air vent 12c side during resin molding in the same manner as described above in the structure in which the logic chip 1 is stacked over the memory chip 3, and other semiconductor chips than the logic chip 1 and the memory chip 3 are not mounted.

Namely, as shown in FIG. 27 (Z4 part of FIG. 26), a difference is caused in loop height between the wires 5 connected to the pads 1c arranged along the side 1f of the logic chip 1 (resin flow direction 14) of FIG. 24 as targets (the same also applies to the side 1f on the opposite side), particularly, between the wires 5 formed on the air vent 12c side as shown in FIG. 27.

Specifically, the adjacent first lead wire 5aa and first lead wire 5ab to be respectively connected to the mutually adjacent leads 4a are arranged so that the loop height of the first lead wire 5aa is set higher, and further, so that the difference in height from the first down bonding wire 5ba next to the first lead wire 5aa is as large as possible.

In other words, it is possible to obtain an effect of suppressing the wire short circuit due to the wire flow for both of the wires 5 formed on the air vent 12c side, and the wires 5 formed in the direction crossing with the resin flow direction 14.

Further, the structure shown in FIG. 28 is a modified example of the structure of FIG. 26, and shows the countermeasure against a wire short circuit targeted for the plurality of wires 5 connected to the pads 1c of the side 1g on the air vent 12c side of the logic chip 1.

Namely, although different from for the wires 5 formed in the direction crossing with the resin flow direction 14, a wire short circuit due to the wire flow tends to occur on the air vent 12c side. For this reason, a difference is caused in loop height among the plurality of wires 5 connected to the pads 1c arranged at the side 1g on the air vent 12c side of the logic chip 1 of FIG. 28 as shown in FIG. 29 (Z5 part of FIG. 28).

Specifically, the adjacent first lead wire 5ac and first lead wire 5ab to be respectively connected to the mutually adjacent leads 4a are arranged so that the loop height of the first lead wire 5ab is set higher, and further, so that the difference in height from the first down bonding wire 5ba next to the first lead wire 5ab is as large as possible.

As a result, the effect of suppressing a wire short circuit can also be obtained for the plurality of wires 5 formed on the air vent 12c side (the wires 5 formed in the direction along the resin flow direction 14).

Figure 31:
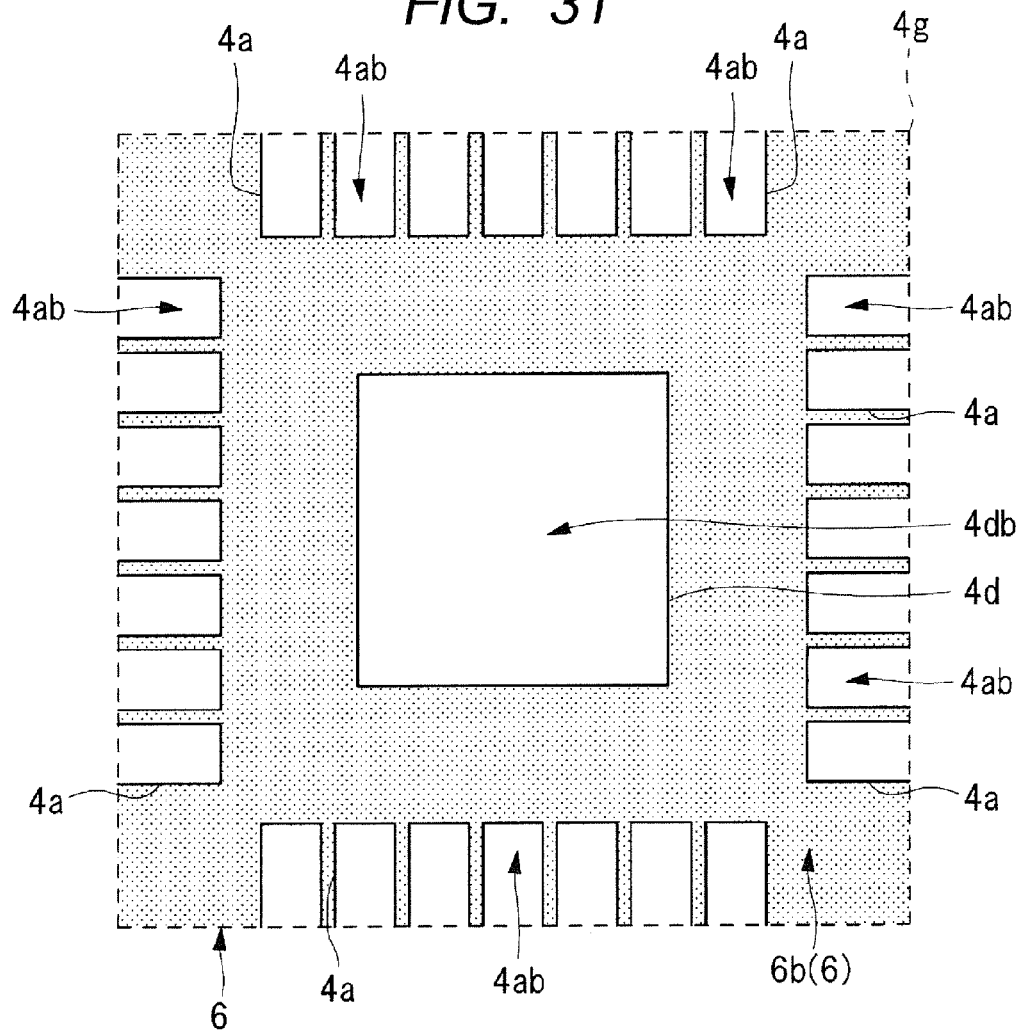
FIG. 31 is a plan view of the back surface (mounting surface) side of FIG. 30.
Figure 32:
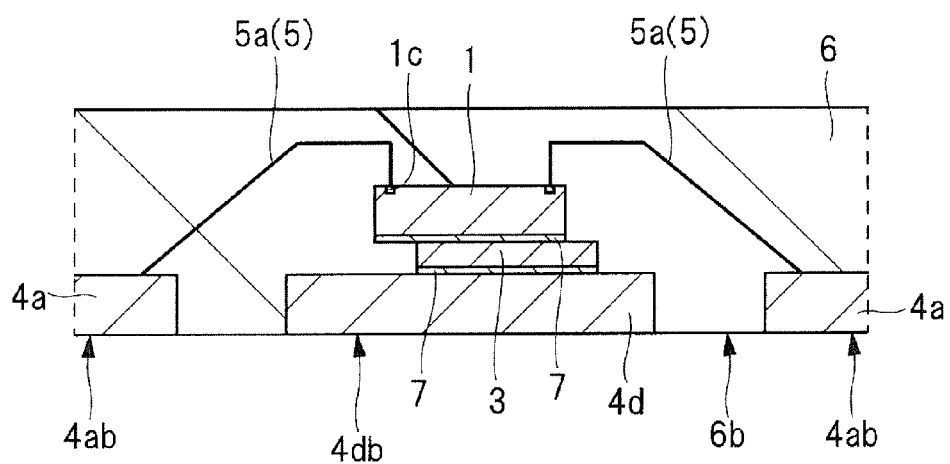
FIG. 32 is a cross-sectional view along line X-X shown in FIG. 30.

After completion of filling of the resin 10, the resin 10 is cured, thereby to form the sealing body 6 shown in FIGS. 30 to 32 described later. As a result, the resin molding step is completed.

Figure 30:
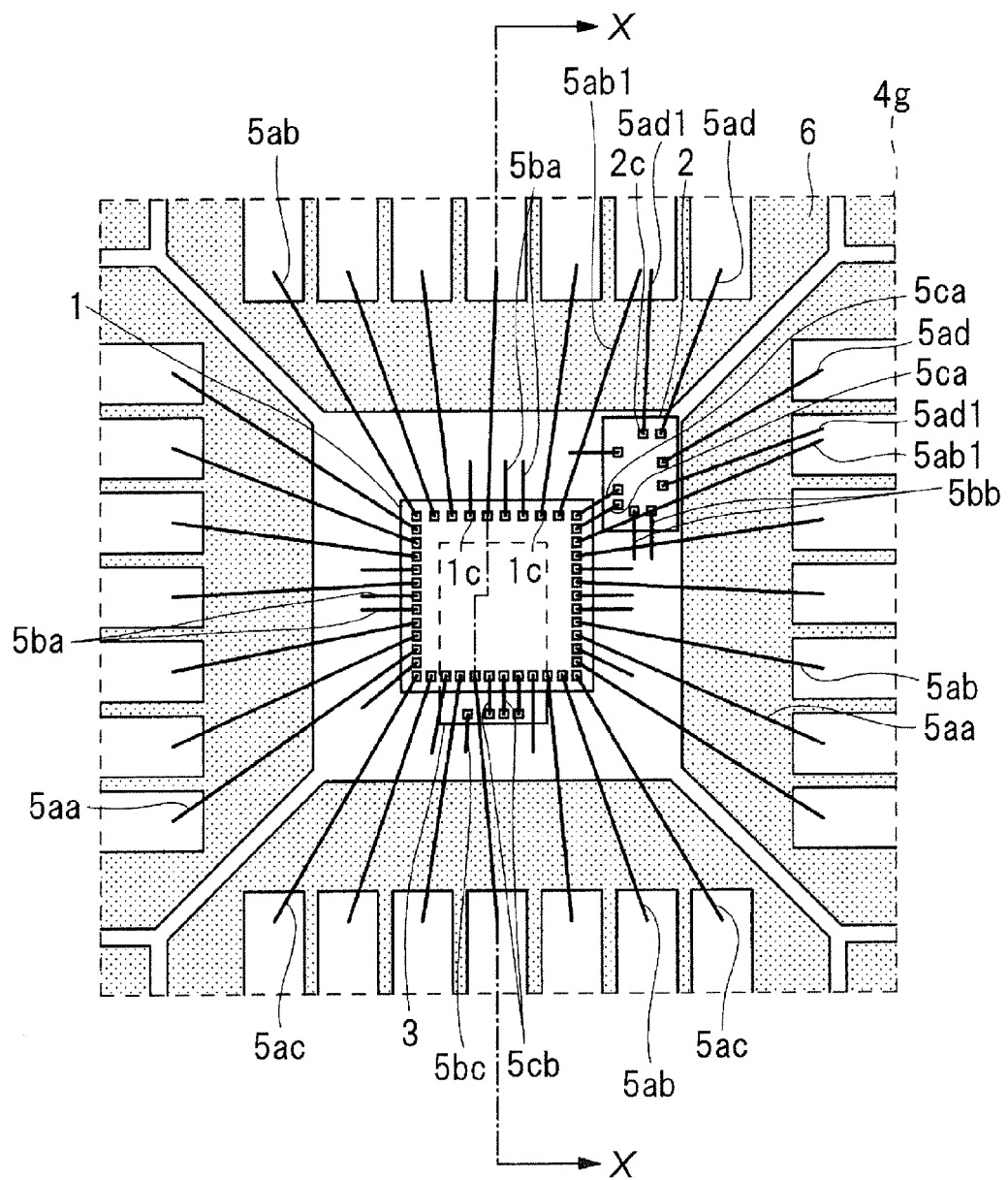
FIG. 30 is a transparent plan view of the structure after a molding step of an embodiment as seen through the sealing body.
Figure 33:
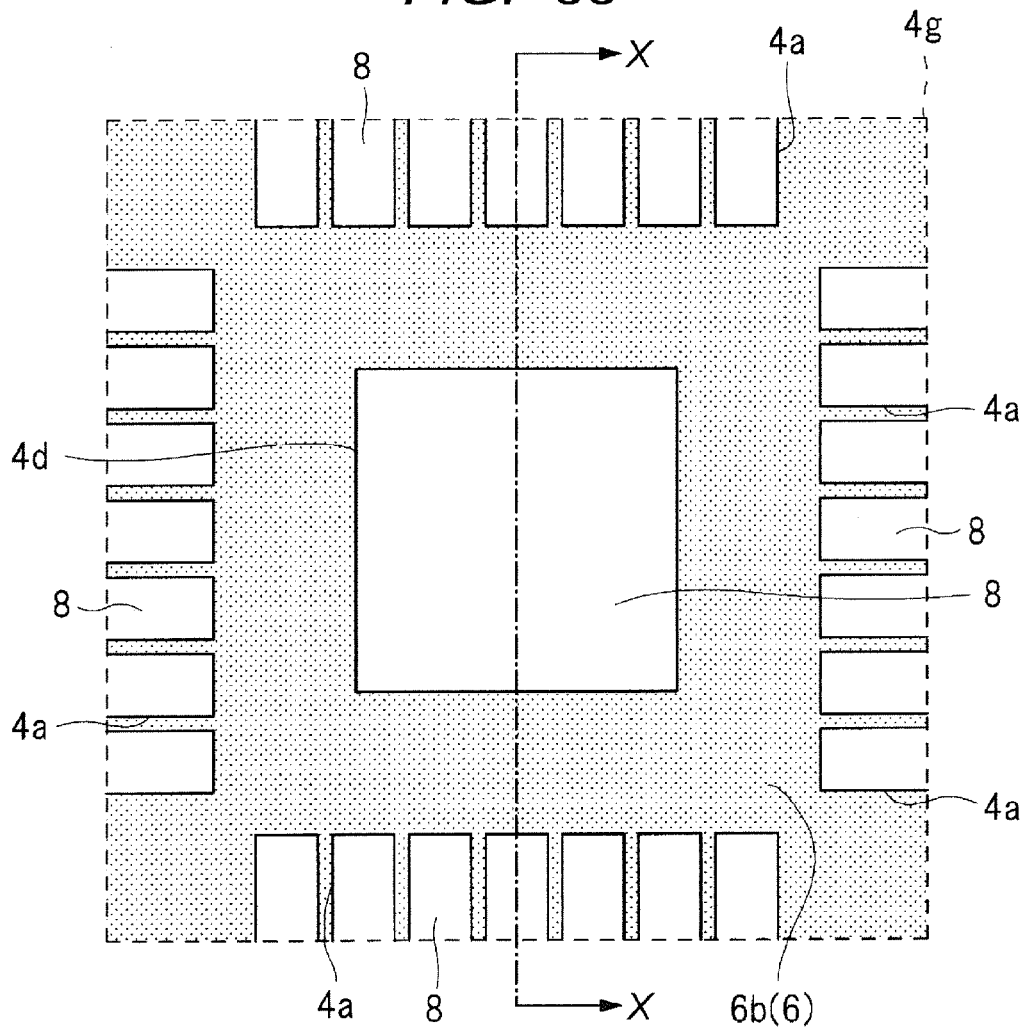
FIG. 33 is a bottom view of the back surface (mounting surface) side of the structure after a plating step of an embodiment.
Figure 34:
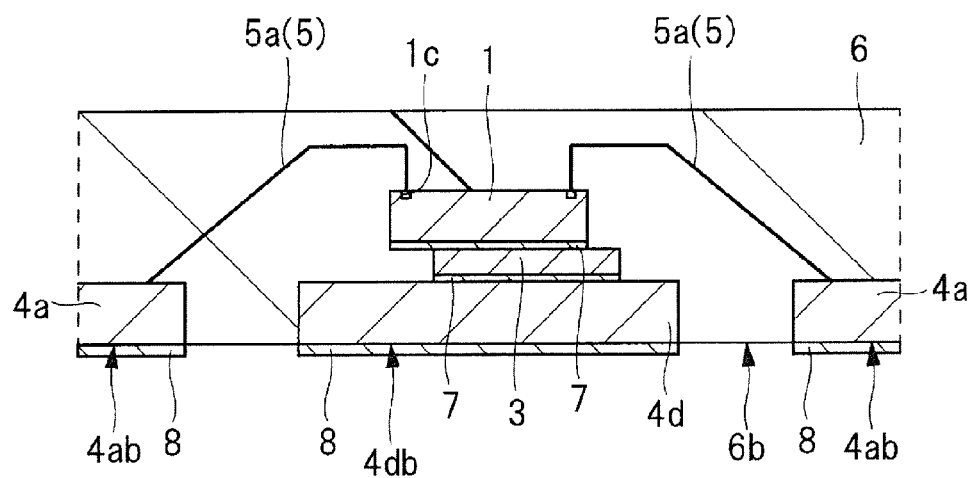
FIG. 34 is a cross-sectional view along line X-X shown in FIG. 33.

FIG. 30 is a transparent plan view of the structure after a molding step of an embodiment as seen through the sealing body; FIG. 31 is a plan view of the back surface (mounting surface) side of FIG. 30; FIG. 32 is a cross-sectional view along line X-X shown in FIG. 30; FIG. 33 is a bottom view of the back surface (mounting surface) side of the structure after a plating step of an embodiment; and FIG. 34 is a cross-sectional view along line X-X shown in FIG. 33.

5. Mark

After completion of resin molding, a mark is given. In the present marking step, as shown in FIG. 1, a mark 6d such as a product name is formed on the surface 6a of the sealing body 6. The mark 6d is formed by, for example, printing or exposure of a laser or the like.

After the formation of the mark, the tape 11 shown in FIG. 19 is released from the lower surface 6b of the sealing body 6 (the lower surface of the lead frame 4). This results in the state in which the lower surface 4ab of each lead 4a and the lower surface 4db of the die pad 4d are exposed at the lower surface 6b of the sealing body 6 as shown in FIGS. 31 and 32.

Incidentally, releasing of the tape 11 may be performed before the formation of the mark. In that case, after releasing the tape, the mark 6d is given on the surface 6a of the sealing body 6.

6. Plating

Then, plating formation is performed. In the present plating step, as shown in FIGS. 33 and 34, an exterior plating (plating film or plating layer) 8 is formed at each of the lower surfaces 4ab of respective leads 4a and the lower surface 4db of the die pad 4d exposed from the sealing body 6. Herein, the exterior plating 8 of the present embodiment is formed of a so-called lead-free solder plating substantially not including lead (Pb), and is, for example, only tin (Sn), tin-bismuth (Sn—Bi), or tin-indium (Sn—In).

As a result, the present invention can also cope with a environmental pollution problem. Incidentally, the lead-free solder means the one having a lead (Pb) content of 0.1 wt % or less. The content is defined as the reference of the RoHS (Restriction of Hazardous Substances) instructions.

7. Singulation

Then, singulation is performed. In the present singulation step, of the dicing region 4i of the lead frame 4 shown in FIG. 7, and the sealing body (resin block) 6 of FIG. 32 formed in the previous sealing (resin molding) step, the portion (a portion of the sealing body 6) formed over the dicing region 4i is cut, thereby to divide the plurality of device regions 4g bonded together into individual pieces.

Incidentally, in the present embodiment, a rotary blade (a dicing blade or a rotary knife) not shown is used as a cutting means. The blade is allowed to run within the dicing region 4i of the lead frame 4. Accordingly, a portion of the frame part 4h of the lead frame 4 and the tie bar are removed. As a result, the device regions 4g are cut from the lead frame 4.

As a result, the assembly of the QFN 9 is completed.

Incidentally, in the present embodiment, in order to clarify the sites (correspondence) of respective parts (such as down bonding regions, sides, and regions), the terms "first" and "second" were described before respective nouns. However, the nouns corresponding to the reference signs do not necessarily mean "first" and "second", respectively. For example, the "down bonding region 4dd" is not necessarily the "first down bonding region". According to the sequence of description, the "down bonding region 4dd" may be described as the "second down bonding region".

Up to this point, the invention made by the present inventors was specifically described by way of embodiments. However, it is naturally understood that the present invention is not limited to the embodiments, and may be variously changed within the scope not departing from the gist thereof.

Modified Example 1

The semiconductor device of the embodiment may be another semiconductor device than QFN in view of the chip layout of the logic chip and the power source IC chip, and the countermeasure against voids in the underlying part of the logic chip during resin molding (a resin is supplied from the side of the side of the memory chip opposite to the side thereof along which the pads (bonding pads: the portions to be wire connected) are formed) when no consideration is given to the countermeasure against a wire short circuit due to the wire flow.

In other words, when no consideration is given to the countermeasure against a wire short circuit due to the wire flow as described above, for example, the semiconductor device may be a QFP (Quad Flat Package). In this case, the structure (form) of the semiconductor device may be a so-called tab-embedded type QFN in which the die pad is not exposed from the sealing body, namely, the suspension leads are subjected to offset (upset) machining so that the upper surface (chip mounting surface) of the die pad is arranged above the upper surface (wire connecting surface) of the lead, or a QFP in which the upper surface (wire connecting surface) of each lead and the upper surface (chip mounting surface) of the die pad are not flush with each other (at the same height).

Modified Example 2

Figure 35:
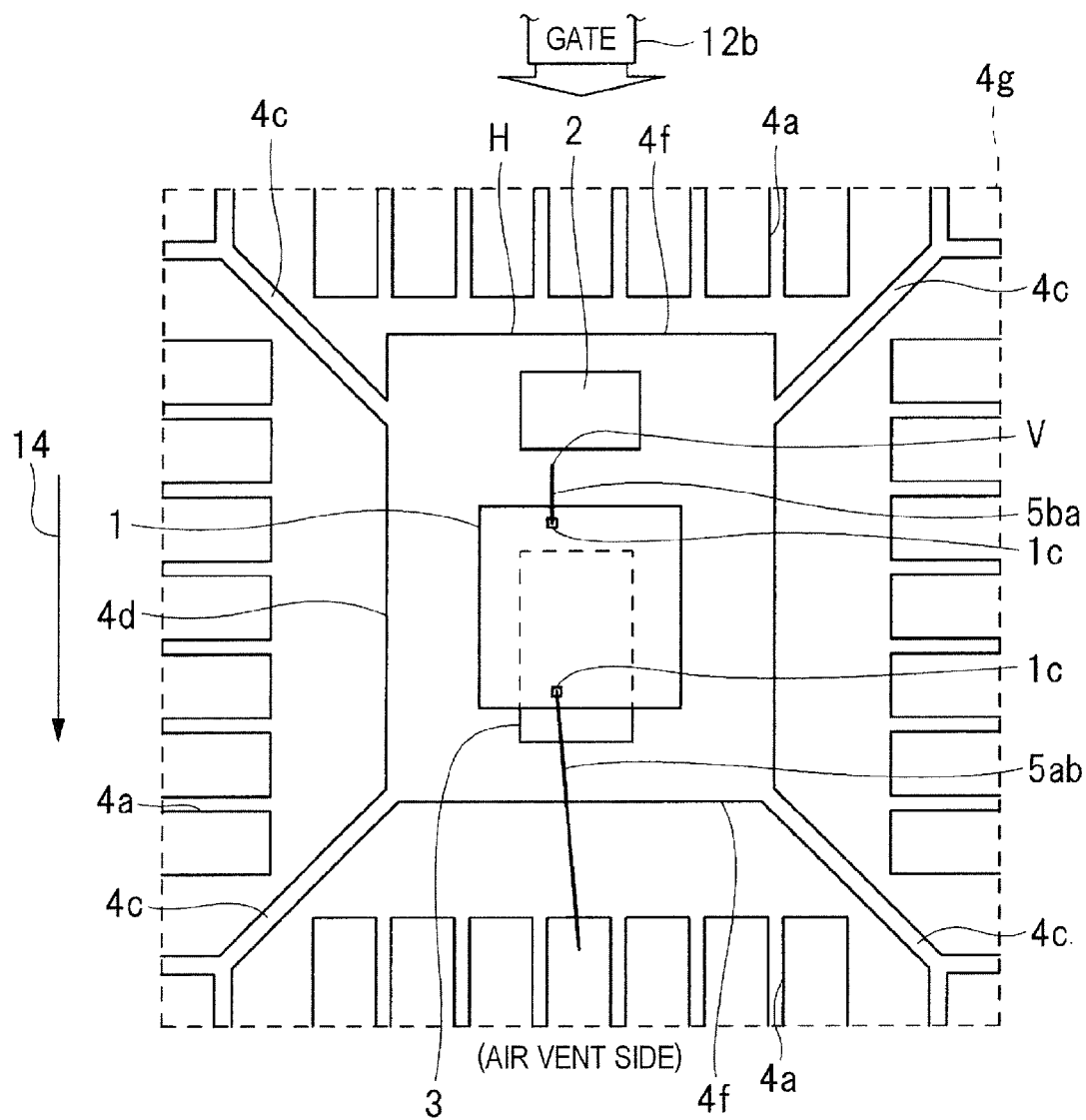
FIG. 35 is a plan view for illustrating Modified Example 2 on the position of the gate with respect to the device region of the lead frame of FIG. 7.
Figure 36:
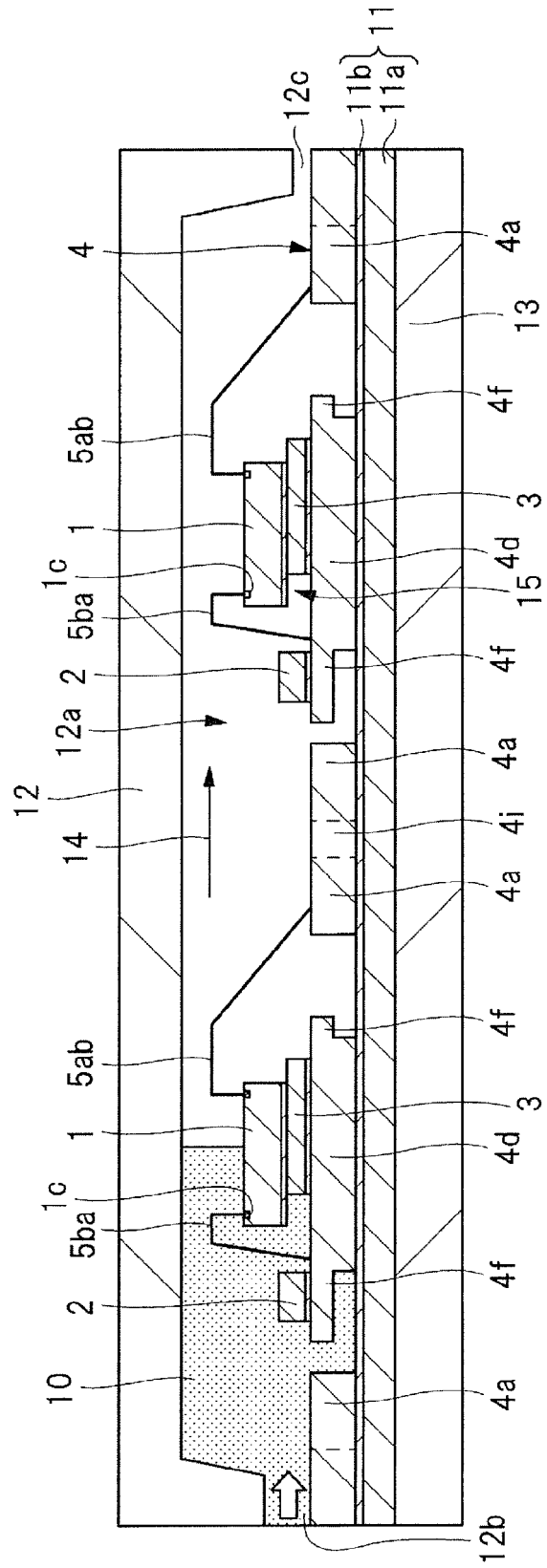
FIG. 36 is a cross-sectional view for illustrating the state in which a resin is supplied into a cavity including the base material shown in FIG. 35 arranged therein.

FIG. 35 is a plan view for illustrating Modified Example 2 on the position of the gate with respect to the device region of the lead frame of FIG. 7; and FIG. 36 is a cross-sectional view for illustrating the state in which a resin is supplied into a cavity including the base material shown in FIG. 35 arranged therein. Incidentally, in FIG. 35, for convenience, in order to easy understanding of the figure, only minimum wires 5 are shown.

Modified Example 2 shown in FIG. 35 is formed so that the protrusion amount (jutting amount) of the step part (jutting part) 4f on the gate 12b side which is the side of the die pad 4d on which the power source IC chip 2 is mounted is larger than that on the air vent side which is the opposite side therefrom.

In this case, as shown in FIG. 36, even when the protrusion amount (jutting amount) of the step part (jutting part) 4f is large, the resin 10 can also be allowed to run (filled) into the underlying portion of the step part (jutting part) 4f during resin filling.

Therefore, while filling the resin 10 into the underlying portion of the step part (jutting part) 4f, and suppressing insufficient resin filling in the underlying portion, just beside a given semiconductor chip (e.g., the logic chip 1) (the region between the down bonding point V and the side H of the die pad 4d next to the down bonding point V), another semiconductor chip (e.g., power source IC chip 2) can be arranged (mounted) as shown in FIG. 35.

Modified Example 3

Figure 37:
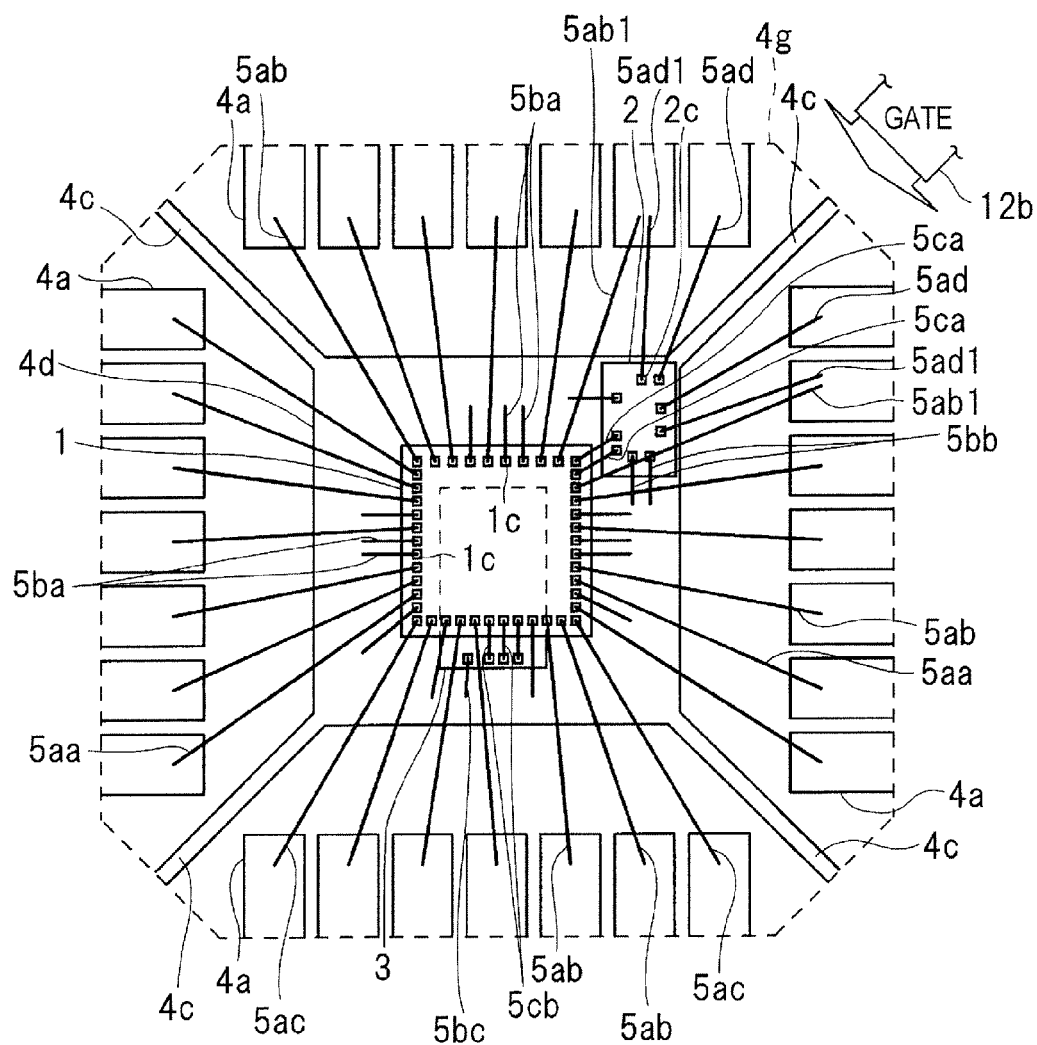
FIG. 37 is a plan view for illustrating Modified Example 3 on the position of the gate with respect to the device region of FIG. 7.

FIG. 37 is a plan view for illustrating Modified Example 3 on the position of the gate with respect to the device region of FIG. 7.

In the embodiments, a description has been given to the case where the resin molding in assembly of the semiconductor device is performed by a batch molding method. However, the resin molding is not limited to the batch molding method, and may be performed by an individual molding method. The individual molding method is the following method: a plurality of semiconductor chips are arranged in a plurality of cavities, respectively; the plurality of semiconductor chips are sealed by the resin supplied into respective cavities of the dies, respectively (the method in which resin molding is performed with each device region covered with each cavity so that respective cavities of the dies and respective device regions of the lead frame are in a one-to-one relation).

Incidentally, when a consideration is given to the respective problems by the individual molding method, preferably, as shown in FIG. 37, the die gate 12b (the portion for supplying a resin) is arranged at the corner part closest to the power source IC chip 2 of the corner parts of the device region 4g to perform resin molding.

Other than these, some of the contents described in the embodiments will be described below.

[Item 1]

A method for manufacturing a semiconductor device, including the steps of:

(a) providing a lead frame having a die pad having a shape in a plan view comprised of quadrangle, a plurality of suspension leads supporting the die pad, and a plurality of leads arranged around the die pad, and arranged between mutually adjacent suspension leads of the suspension leads;

(b) after the step (a), mounting, over the die pad, a first semiconductor chip having a first main surface having a shape in a plan view comprised of quadrangle, a plurality of first bonding pads formed over the first main surface, and a first back surface opposite to the first main surface;

(c) after the step (b), mounting a semiconductor chip having a second main surface having a shape in a plan view comprised of quadrangle, a plurality of second bonding pads formed over the first main surface, and a second back surface opposite to the second main surface over the first main surface of the first semiconductor chip; and (d) after the step (c), sealing the first and second semiconductor chips with a resin.

Herein, in the step (c), the first bonding pads of the first semiconductor chip are exposed from the second semiconductor chip, and the second semiconductor chip is mounted over the first semiconductor chip such that a part of the second semiconductor chip juts out from the first semiconductor chip.

In the step (d), the resin is supplied from the part side of the second semiconductor chip.

What is claimed is:

1. A semiconductor device, comprising:
(a) a die pad including:
a first surface,
a second surface opposite to the first surface,
a first side surface located between the first surface and the second surface,
a second side surface located between the first surface and the second surface, and opposite to the first side surface, and
a first step part protruding from the first side surface;
(b) a first component mounted on the die pad, and also arranged on the first surface of the die pad;
(c) a second component mounted on the die pad, and also arranged on the first step part; and
(d) a sealing body sealing the first component and the second component such that the sealing body exposes the second surface of the die pad and covers the first step part,
wherein the second component is spaced from the first component in a plan view, and arranged side-by-side with the first component along a first direction extending from the second side surface toward the first side surface.

2. The semiconductor device according to claim 1,
wherein the first component further comprises a first pad,
wherein the first pad is electrically connected with a first bonding region of the first surface via a first wire, and
wherein the first bonding region is located between the first component and the second component.

3. The semiconductor device according to claim 2,
wherein a third component is mounted on the first surface of the die pad, and also arranged on the first surface of the die pad,
wherein the first component is mounted on the first surface of the die pad via the third component such that the first component exposes a first portion of the third component,
wherein a second pad arranged at the first portion of the third component is electrically connected with a second bonding region of the first surface via a second wire, and
wherein the first component is arranged between the first bonding region and the second bonding region in the plan view.

4. The semiconductor device according to claim 1,
wherein the die pad further comprises a second step part protruding from the second side surface,
wherein the second step part is covered with the sealing body, and
wherein the first step part protrudes in the first direction a greater than the second step part protrudes in the first direction.

5. The semiconductor device according to claim 1,
wherein the first component further comprises a third pad,
wherein the second component further comprises a fourth pad, and
wherein the third pad is electrically connected with the fourth pad via a third wire.

6. A semiconductor device, comprising:
(a) a die pad including:
a first surface,
a second surface opposite to the first surface,
a first side surface located between the first surface and the second surface, a second side surface located between the first surface and the second surface, and opposite to the first side surface, and a first step part protruding from the first side surface;

(b) a first component mounted on the die pad, and arranged on the first surface of the die pad;

(c) a second component mounted on the die pad, and also arranged on the first step part; and (d) a sealing body sealing the first component and the second component such that the sealing body exposes the second surface of the die pad and covers the first step part, wherein the second component is spaced from the first component in a plan view, and wherein the first component and the second component are arranged along a first direction extending from the second side surface toward the first side surface.

7. The semiconductor device according to claim 6, wherein the first component further comprises a first pad, wherein the first pad is electrically connected with a first bonding region of the first surface via a first wire, and wherein the first bonding region is located between the first component and the second component.

8. The semiconductor device according to claim 7, wherein a third component is mounted on the die pad, and also arranged on the first surface of the die pad, wherein the first component is mounted on the first surface of the die pad via the third component such that the first component exposes a first portion of the third component, wherein a second pad arranged at the first portion of the third component is electrically connected with a second bonding region of the first surface via a second wire, and wherein the first component, the second component, the first bonding region and the second bonding region are arranged along the first direction.

9. The semiconductor device according to claim 6, wherein the die pad further comprises a second step part protruded from the second side surface, wherein the second step part is covered with the sealing body, and wherein in the first direction, a length of the first step part is greater than a length of the second step part.

10. The semiconductor device according to claim 6, wherein the first component further comprises a third pad, wherein the second component further comprises a fourth pad, and wherein the third pad is electrically connected with the fourth pad via a third wire.

11. A semiconductor device, comprising:

(a) a die pad including:

(a1) a first part, having:

a first surface, a second surface opposite to the first surface, (a2) a second part, having:

a third surface, and a fourth surface opposite to the third surface;

(b) a first component mounted on the first surface of the first part of the die pad;

(c) a second component mounted on the third surface of the second part of the die pad; and (d) a sealing body sealing the first component and the second component such that the sealing body exposes the second surface of the first part and covers the fourth surface of the second part, wherein the second part is connected with the first part, wherein a thickness of the second part is less than a thickness of the first part, and wherein the second component is spaced from the first component in a plan view, and also arranged side-by-side with the first component.

12. The semiconductor device according to claim 11, wherein the first component further comprises a first pad, wherein the first pad is electrically connected with a first bonding region of the first surface of the first part of the die pad via a first wire, and wherein the first bonding region is located between the first component and the second component.

13. The semiconductor device according to claim 12, wherein a third component is mounted on the first surface of the first part of the die pad, wherein the first component is mounted on the first surface of the first part of the die pad via the third component such that the first component exposes a first portion of the third component, wherein a second pad arranged at the first portion of the third component is electrically connected with a second bonding region of the first surface of the first part of the die pad via a second wire, and wherein the first component is arranged between the first bonding region and the second bonding region in the plan view.

14. The semiconductor device according to claim 11, wherein the die pad further comprises a third part connected with the first part, wherein the third part has a fifth surface and a sixth surface opposite to the fifth surface, wherein a thickness of the third part is less than a thickness of the first part, wherein the sixth surface of the third part is covered with the sealing body, and wherein the first part is located between the second part and the third part.

15. The semiconductor device according to claim 11, wherein the first component further comprises a third pad, wherein the second component further comprises a fourth pad, and wherein the third pad is electrically connected with the fourth pad via a third wire.

* * * * *